(12) United States Patent
Son et al.

(10) Patent No.: US 11,121,154 B2
(45) Date of Patent: *Sep. 14, 2021

(54) SEMICONDUCTOR DEVICE INCLUDING A STACK HAVING A SIDEWALL WITH RECESSED AND PROTRUDING PORTIONS

(71) Applicant: SAMSUNG ELECTRONICS CO., LTD., Suwon-si (KR)

(72) Inventors: Byoungkeun Son, Hwaseong-si (KR); Yoocheol Shin, Hwaseong-si (KR); Changhyun Lee, Suwon-si (KR); Hyunjung Kim, Suwon-si (KR); Chung-Il Hyun, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/811,171

(22) Filed: Mar. 6, 2020

(65) Prior Publication Data

US 2020/0212063 A1 Jul. 2, 2020

Related U.S. Application Data

(63) Continuation of application No. 16/516,793, filed on Jul. 19, 2019, now Pat. No. 10,586,808, which is a (Continued)

(30) Foreign Application Priority Data

May 30, 2014 (KR) .................. 10-2014-0065922

(51) Int. Cl.
*H01L 27/11582* (2017.01)
*H01L 21/28* (2006.01)
(Continued)

(52) U.S. Cl.
CPC .... *H01L 27/11582* (2013.01); *H01L 27/1157* (2013.01); *H01L 27/11519* (2013.01);
(Continued)

(58) Field of Classification Search
CPC ......... H01L 27/11556; H01L 27/11519; H01L 27/11524; H01L 27/11566; H01L 27/1157; H01L 27/11582
See application file for complete search history.

(56) References Cited

U.S. PATENT DOCUMENTS 8,154,068 B2  4/2012  Katsumata et al.
8,187,936 B2  5/2012  Alsmeier et al.
(Continued)

FOREIGN PATENT DOCUMENTS

KR   10-2011-0015337 A   2/2011
KR   10-2011-0128717 A   11/2011
(Continued)

*Primary Examiner* — Herve-Louis Y Assouman
(74) *Attorney, Agent, or Firm* — Lee IP Law, P.C.

(57) ABSTRACT

A semiconductor device includes a substrate, a stack, and channel structures penetrating the stack. The stack includes gate electrodes and insulating layers alternately and repeatedly stacked on the substrate, and extending in a first direction. The channel structures in a first row are spaced apart from each other in the first direction. The stack includes a first sidewall that includes first recessed portions and first protruding portions. Each of first recessed portions is defined by an adjacent pair of the first recessed portions. Each of the first recessed portions has a shape recessed toward a first region of the stack between an adjacent pair of the channel structures of the first row. Each of the first recessed portions has a width that decreases in a direction toward the first region when measured along the first direction.

20 Claims, 20 Drawing Sheets

Related U.S. Application Data continuation of application No. 15/935,498, filed on Mar. 26, 2018, now Pat. No. 10,411,031, which is a continuation of application No. 15/456,841, filed on Mar. 13, 2017, now Pat. No. 9,947,686, which is a continuation of application No. 14/724,952, filed on May 29, 2015, now Pat. No. 9,627,396.

(51) Int. Cl.

| | |
|---|---|
| H01L 27/11524 | (2017.01) |
| H01L 27/11565 | (2017.01) |
| H01L 27/1157 | (2017.01) |
| H01L 27/11556 | (2017.01) |
| H01L 27/11519 | (2017.01) |

(52) U.S. Cl.
CPC .. *H01L 27/11524* (2013.01); *H01L 27/11556* (2013.01); *H01L 27/11565* (2013.01); *H01L 29/40117* (2019.08)

(56) References Cited

U.S. PATENT DOCUMENTS

| | | | |
|---|---|---|---|
| 8,283,228 B2 | 10/2012 | Alsmeier | |
| 8,455,940 B2 | 6/2013 | Lee et al. | |
| 8,456,909 B2 | 6/2013 | Lee et al. | |
| 8,501,609 B2 | 8/2013 | Roizin et al. | |
| 8,508,999 B2 | 8/2013 | Liu et al. | |
| 8,872,256 B2 | 10/2014 | Lee et al. | |
| 8,969,947 B2 | 3/2015 | Lee et al. | |
| 9,947,686 B2 | 4/2018 | Son et al. | |
| 10,411,031 B2 | 9/2019 | Son et al. | |
| 10,586,808 B2 * | 3/2020 | Son | H01L 27/11556 |
| 2010/0171162 A1 | 7/2010 | Katsumata et al. | |
| 2011/0227141 A1 | 9/2011 | Jeong et al. | |
| 2011/0260237 A1 | 10/2011 | Lee et al. | |
| 2012/0001252 A1 | 1/2012 | Alsmeier et al. | |
| 2012/0068255 A1 | 3/2012 | Lee et al. | |
| 2012/0086072 A1 | 4/2012 | Yun et al. | |
| 2012/0098050 A1 | 4/2012 | Shim et al. | |
| 2012/0170368 A1 | 7/2012 | Lee et al. | |
| 2012/0220088 A1 | 8/2012 | Alsmeier | |
| 2012/0228697 A1 | 9/2012 | Youm | |
| 2012/0295409 A1 | 11/2012 | Yun et al. | |
| 2013/0009229 A1 | 1/2013 | Lee et al. | |
| 2013/0052803 A1 | 2/2013 | Roizin et al. | |
| 2013/0083601 A1 | 4/2013 | Liu et al. | |
| 2013/0252391 A1 | 9/2013 | Lee et al. | |
| 2013/0313631 A1 | 11/2013 | Yang et al. | |

FOREIGN PATENT DOCUMENTS

| | | |
|---|---|---|
| KR | 10-2012-0129284 A | 11/2012 |
| KR | 10-2013-0116604 A | 10/2013 |
| KR | 10-2013-0130480 A | 12/2013 |

* cited by examiner

SEMICONDUCTOR DEVICE INCLUDING A STACK HAVING A SIDEWALL WITH RECESSED AND PROTRUDING PORTIONS

CROSS-REFERENCE TO RELATED APPLICATIONS

This is a continuation application based on pending application Ser. No. 16/516,793, filed Jul. 19, 2019, which in turn is a continuation of U.S. patent application Ser. No. 15/935,498, filed on Mar. 26, 2018, which is a continuation of U.S. patent application Ser. No. 15/456,841, filed on Mar. 13, 2017, which is a continuation of U.S. patent application Ser. No. 14/724,952, filed on May 29, 2015, which claims priority under 35 U.S.C. § 119 to Korean Patent Application No. 10-2014-0065922, filed on May 30, 2014, in the Korean Intellectual Property Office, the entire contents of each of the above-referenced applications being hereby incorporated by reference.

BACKGROUND

Example embodiments of inventive concepts relate to a semiconductor device, and in particular, to a three-dimensional semiconductor memory device including three-dimensionally arranged memory cells.

Higher integration of semiconductor devices may help satisfy consumer demands for superior performance and inexpensive prices. In the case of semiconductor devices, since their integration is an important factor in determining product prices, increased integration may reduce prices. In the case of typical two-dimensional or planar semiconductor devices, since their integration is mainly determined by the area occupied by a unit memory cell, integration is greatly influenced by the level of a fine pattern forming technology. However, the extremely expensive process equipment used to increase pattern fineness sets a practical limitation on increasing integration for two-dimensional or planar semiconductor devices.

To overcome such a limitation, there have been recently proposed three-dimensional semiconductor memory devices having three-dimensionally arranged memory cells. However, in order to send three-dimensional semiconductor memory devices into mass-production, a process technology that provides a lower manufacturing cost per bit than two-dimensional memory devices while maintaining or exceeding their level of reliability is desired.

Meanwhile, to increase an integration density of a three-dimensional semiconductor memory device, it is necessary to increase the number of memory cell layers. However, in the case where the number of the memory cell layers is increased, a stack of the memory cell layers may collapse or fall. This falling may be limited (and/or prevented) by reducing a thickness of each memory cell layer, but in this case, a cell dissolution phenomenon may occur.

SUMMARY

Example embodiments of inventive concepts relate to a semiconductor device configured to limit (and/or prevent) a cell dissolution phenomenon from occurring and have higher structural stability.

According to example embodiments of inventive concepts, a semiconductor device may include a substrate; a stack on the substrate, the stack including gate electrodes and insulating layers alternately and repeatedly stacked on the substrate, the gate electrodes and the insulating layer extending in a first direction parallel to a top surface of the substrate; and a first row of channel structures penetrating the stack. The channel structures in the first row may be arranged spaced apart from each other in the first direction. The stack may have a first sidewall extending in the first direction. The first sidewall may have first recessed portions and first protruding portions. Each of the first protruding portions may be defined by an adjacent pair of the first recessed portions. Each of the first recessed portions may have a shape recessed toward a first region of the stack between an adjacent pair of the channel structures of the first row. Each of the first recessed portions may have a width that decreases in a direction toward the first region when measured along the first direction.

In example embodiments, the first recessed portions may be extended from a top of the stack to a bottom of the stack.

In example embodiments, the semiconductor device may further include a second row of channel structures penetrating the stack. The channel structures in the second row may be arranged spaced apart from each other in the first direction. The first and second rows may be spaced apart from each other in a second direction crossing the first direction. The stack may have a second sidewall extending in the first direction and facing the first sidewall. The second sidewall may have second recessed portions and second protruding portions, each of which may be defined by an adjacent pair of the second recessed portions. Each of the second recessed portions may have a shape recessed toward a second region between an adjacent pair of the channel structures of the second row. Each of the second recessed portions may have a width that decreases in a direction toward the second region when measured along the first direction.

In example embodiments, each of the channel structures of the first row may not be overlapped with the channel structures of the second row in the second direction.

In example embodiments, the semiconductor device may further include third and fourth rows of channel structures penetrating the stack. The third and fourth rows of channel structure may be provided between the first and second rows of channel structures. The channel structures of each of the third and fourth rows may be arranged spaced apart from each other in the first direction.

In example embodiments, each of the channel structures of the first row may be overlapped with a corresponding one of the channel structures of the fourth row in the second direction. Each of the channel structures of the second row may be overlapped with the corresponding one of the channel structures of the third row in the second direction. Each of the channel structures of the first row may not be overlapped with the channel structures of the second row in the second direction.

In example embodiments, each of the first protruding portions may have one of a triangular shape, a trapezoidal shape, and a semi-circular shape.

In example embodiments, the first sidewall may include first and second straight lines that have first and second lengths, respectively. The first and second straight lines may meet each other at an angle θ ranging from −45° to 45°. The second length may be shorter than a distance obtained by dividing the first length by cos θ. Here, the first length may be a distance from a center of each channel structure of the first row to an end of a corresponding one of the first protruding portions adjacent thereto, and the second length may be a distance from the center of each channel structure of the first row to a point of a side surface of a corresponding one of the first protruding portions.

In example embodiments, the semiconductor device may further include vertical insulators between the stack and the channel structures. Each of the vertical insulators includes a charge storing layer.

In example embodiments, the gate electrodes may fill gap regions between the insulating layers.

According to example embodiments of inventive concepts, a semiconductor device may include a substrate, a stack, and a plurality of channel structures. The stack may include gate electrodes and insulating layers alternately stacked on top of each other on the substrate. The gate electrodes and insulating layers may define a first row of channel holes that are spaced apart from each other in a first direction that crosses a second direction. The stack may include a first sidewall extending over the substrate in a third direction that crosses the first and second directions. The first sidewall may include a plurality of first protruding portions. A width of the first protruding portions measured in the first direction may decrease as the first protruding portions protrude outward in the second direction away from the first row of the channel holes. The plurality of channel structures may be spaced apart from each other and extend vertically through the stack. The plurality of channel structures may include a first row of channel structures in the first row of channel holes.

In example embodiments, each of the first protruding portions may have one of a triangular shape, a trapezoidal shape, and a semi-circular shape.

In example embodiments, the semiconductor device may further include vertical insulators between the gate electrodes and the plurality of channel structures. Each of the vertical insulators may include a charge storing layer.

In example embodiments, the gate electrodes and insulating layers may define a second row of channel holes that are spaced apart from each other in the first direction. The first row of channel holes and the second channel holes may be spaced apart from each other in the second direction and offset in the first direction such that the channel holes in the first row and the second row are arranged in a zig zag pattern. The plurality of channel structures may include a second row of channel structures in the second row of channel holes. The stack may include a second sidewall opposite the first sidewall. The second sidewall may include a plurality of second protruding portions. A width of the second protruding portions measured in the first direction may decrease as the second protruding portions protrude outward in the second direction away from the second row of the channel holes. The first protruding portions may be arranged side-by-side with each other in the first direction along the first sidewall. The second protruding portions may be arranged side-by-side with each other in the first direction along the second sidewall.

In example embodiments, the semiconductor device may further include bit lines on the substrate and extending in the second direction. The bit lines may be spaced apart from each other in the first direction. Some of the bit lines may be on top of corresponding channel structures in the first row of channel structures. The substrate may include a common source region. The gate electrodes may be on top of at least a portion of the common source region.

According to example embodiments of inventive concepts, a semiconductor device may include a substrate; a stack including gate electrodes stacked on top of each and spaced apart from each other in a vertical direction on the substrate, the stack defining channel holes that extend through the gate electrodes in the vertical direction to the substrate, the channel holes being spaced apart from each other in a zig zag pattern, the stack including a first sidewall adjacent to the channel holes, the first sidewall including a plurality of first protruding portions defined by first recessed portions, the first protruding portions being protruded in a second direction away from the first row of the channel holes, and the first recessed portions being recessed toward to the second row of the channel holes; a common source region in an upper portion of the substrate, the common source region extending in a zig zag pattern along with the first sidewall, when viewed in a plan view; and a plurality of channel structures in the channel holes.

In example embodiments, the channel holes in a first row may be spaced apart from each other in a first direction, the channel holes in a second row may be spaced apart from each other in the first direction, the first sidewall may be adjacent to the first row of the channel holes, and the stack may further include a second sidewall opposite the first sidewall and adjacent to the second row of the channel holes.

In example embodiments, the semiconductor device may further include vertical insulators between the gate electrodes and the plurality of channel structures. Each of the vertical insulators may include a charge storing layer.

In example embodiments, each of the first protruding portions may have one of a triangular shape, a trapezoidal shape, and a semi-circular shape.

BRIEF DESCRIPTION OF THE DRAWINGS

Example embodiments will be more clearly understood from the following brief description taken in conjunction with the accompanying drawings. The accompanying drawings represent non-limiting example embodiments as described herein.

Figure 1:
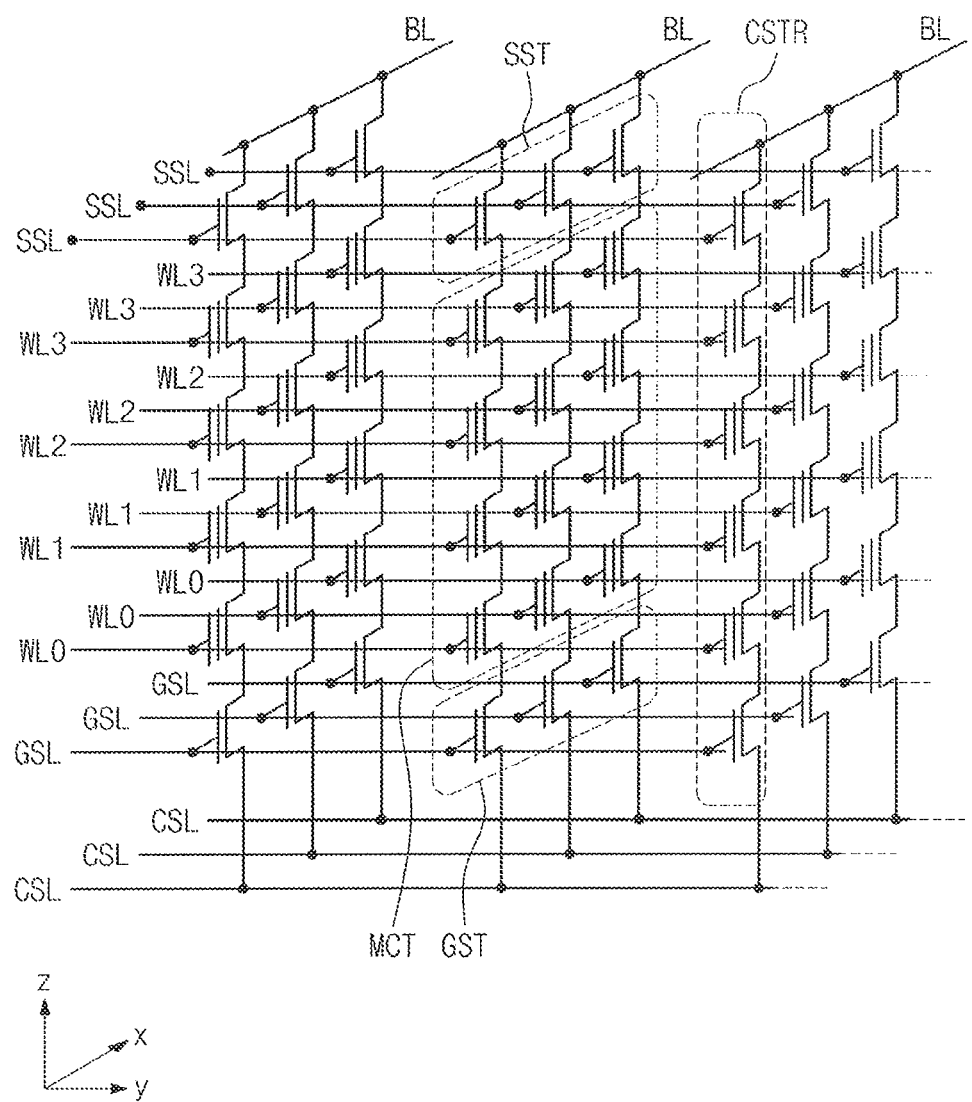
FIG. 1 is a schematic circuit diagram illustrating a cell array of a three-dimensional semiconductor memory device according to example embodiments of inventive concepts.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of inventive concepts will now be described more fully with reference to the accompanying drawings, in which some example embodiments are shown. Example embodiments of inventive concepts may, however, be embodied in many different forms and should not be construed as being limited to the embodiments set forth herein; rather, these embodiments are provided so that this disclosure will be thorough and complete, and will fully convey the scope of example embodiments to those of ordinary skill in the art. In the drawings, the thicknesses of layers and regions may be exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on"). As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern. Unless otherwise defined, all terms (including technical and scientific terms) used herein have the same meaning as commonly understood by one of ordinary skill in the art to which example embodiments of inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a schematic circuit diagram illustrating a cell array of a three-dimensional semiconductor memory device according to example embodiments of inventive concepts.

Referring to FIG. 1, a three-dimensional semiconductor memory device according to example embodiments of inventive concepts may include a cell array, in which at least one common source line CSL, a plurality of bit lines BL, and a plurality of cell strings CSTR provided therebetween are included.

The common source line CSL may be a conductive layer disposed on a substrate or an impurity region formed in the substrate. The bit lines BL may be conductive patterns (e.g., metal lines) spaced apart from the substrate and disposed over the substrate. The bit lines BL may be two-dimensionally arranged and a plurality of cell strings CSTR may be connected in parallel to each of the bit lines BL. The cell strings CSTR may be connected in common to the common source line CSL. For example, a plurality of the cell strings CSTR may be disposed between the bit lines BL and the common source line CSL. In example embodiments, a plurality of common source lines CSL may be provided and be two-dimensionally arranged on the substrate. In example embodiments, the common source lines CSL may be applied with the same voltage. Alternatively, in example embodiments, the common source lines CSL may be separated from each other and thereby may be independently controlled.

Each of the cell strings CSTR may include a ground selection transistor GST coupled to the common source line CSL, a string selection transistor SST coupled to the bit line BL, and a plurality of memory cell transistors MCT disposed between the ground and string selection transistors GST and SST. Furthermore, the ground selection transistor GST, the string selection transistor SST, and the memory cell transistors MCT may be connected in series. Although FIG. 1 illustrates a non-limiting example where each cell string CSTR includes 4 memory cell transistors MCT between one ground selection transistor GST and one string selection transistor SST, example embodiments are not limited thereto. For example, the number of memory cell transistors MCT may be varied to a number that is greater than 4 or less than 4 in each cell strings CSTR. Also, in each cell string CSTR, the number of ground select transistors GST and/or string select transistors SST may be more than 1 (e.g. 2 SST and/or 2 GST).

The common source line CSL may be connected in common to source regions of the ground selection transistors GST. Furthermore, a ground selection line GSL, a plurality of word lines WL0-WL3, and a plurality of string selection lines SSL, which are disposed between the common source line CSL and the bit lines BL, may serve as gate electrodes of the ground selection transistor GST, the memory cell transistors MCT and the string selection transistors SST. In addition, each of the memory cell transistors MCT may include a data storage element.

Although FIG. 1 of the present application illustrates the string selection transistor SST and ground selection transistor GST have single-gate structures, example embodiments are not limited thereto. For example, in example embodiments, the string selection transistor SST and/or the ground selection transistor GST alternatively have a structure that includes a floating gate. In other words, in example embodiments, the string selection transistor SST and/or the ground selection transistor GST alternatively have a structure that is the same as the memory cell transistors MCT.

Figure 2A:
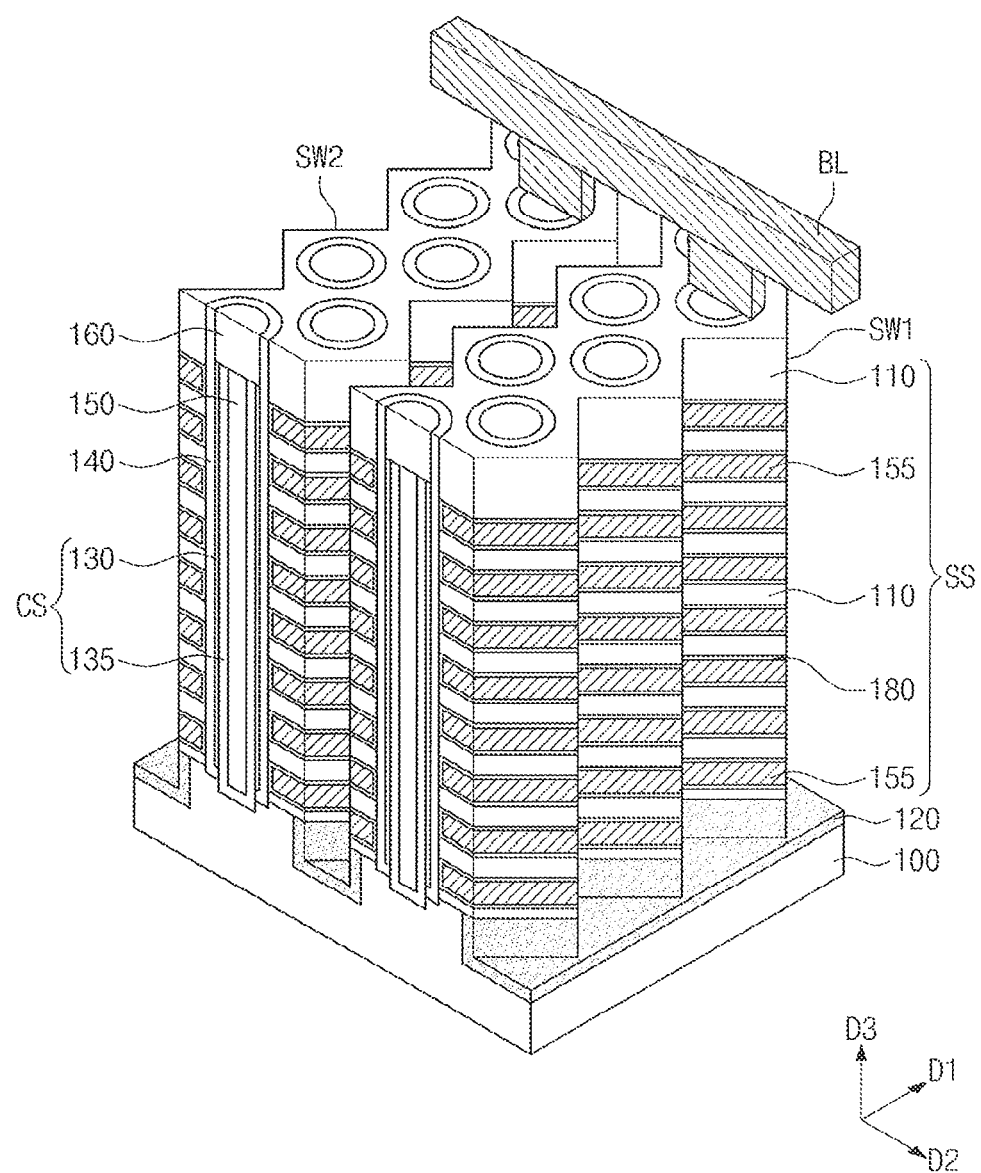
FIG. 2A is a perspective view illustrating a three-dimensional semiconductor memory device according to example embodiments of inventive concepts.
Figure 2B:
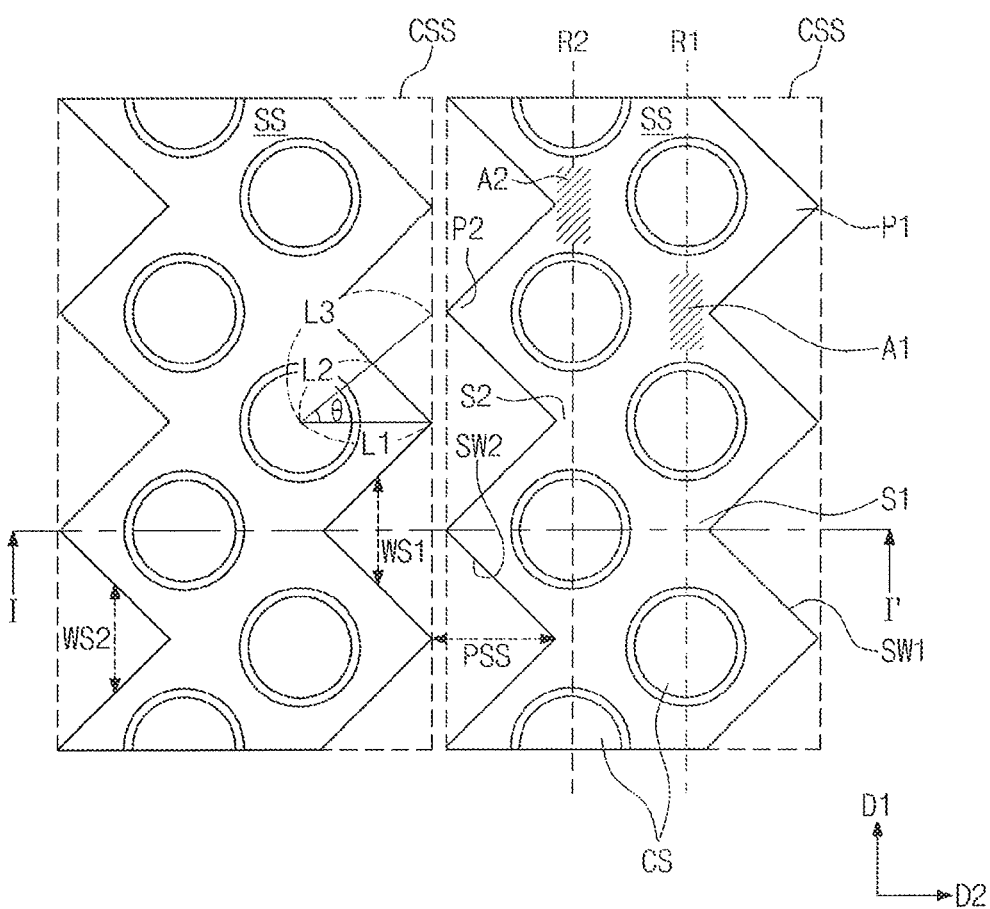
FIG. 2B is a plan view illustrating a three-dimensional semiconductor memory device according to example embodiments of inventive concepts.
Figure 2C:
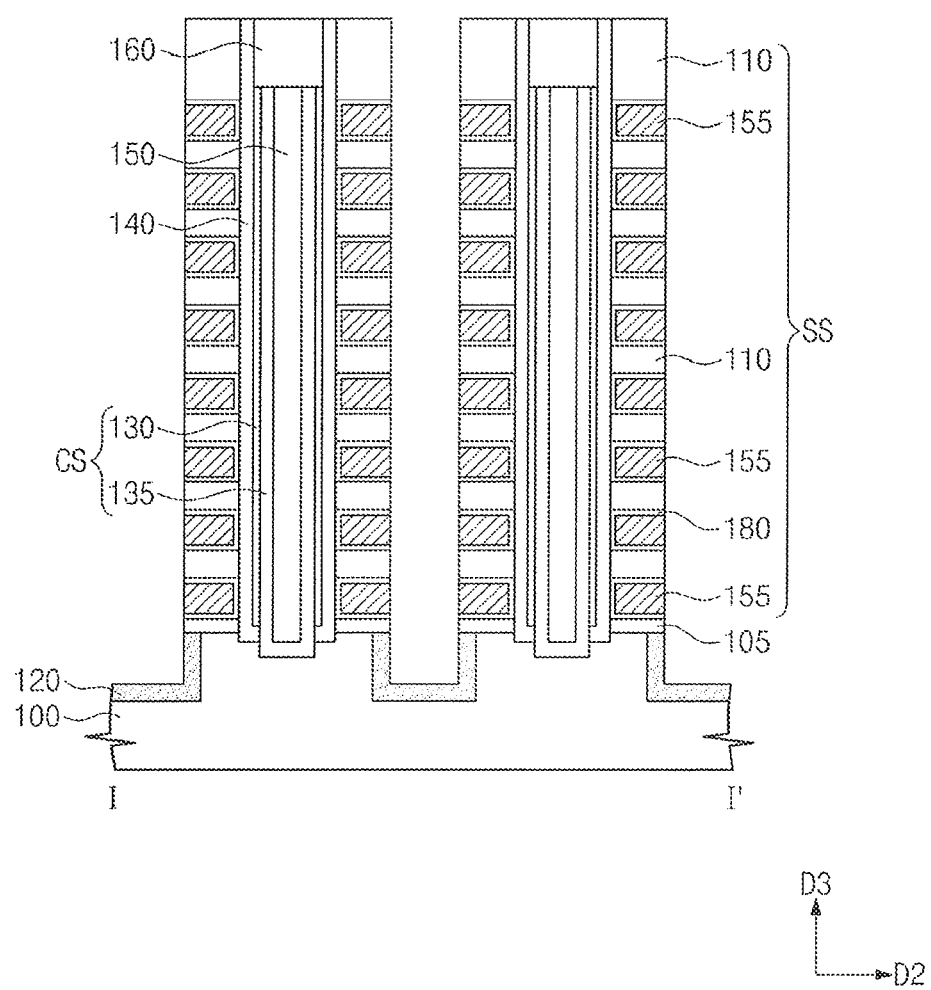
FIG. 2C is a sectional view taken along line I-I' of FIG. 2B.

FIG. 2A is a perspective view illustrating a three-dimensional semiconductor memory device according to example embodiments of inventive concepts. FIG. 2B is a plan view illustrating a three-dimensional semiconductor memory device according to example embodiments of inventive concepts. FIG. 2C is a sectional view taken along line I-I' of FIG. 2B.

Referring to FIGS. 2A through 2C, gate electrodes 155 and insulating layers 110 may be alternately and repeatedly stacked on a substrate 100 to form a stack SS. The substrate 100 may be, for example, a silicon wafer, a germanium wafer, or a silicon-germanium wafer. The substrate 100 may include doped common source regions 120. The common source regions 120 may be line-shape structures extending along a first direction D1 and may be arranged in a second direction D2 crossing the first direction D1.

When viewed in a plan view, the stack SS may be a line-shaped structure extending parallel to the first direction D1. The common source regions 120 may be provided at both sides of the stack SS. The common source regions 120 may be defined by both sidewalls SW1 and SW2 of the stacks SS. Therefore, each of the common source regions 120 may be a line shape elongated along the first direction D1 in a zigzag manner, when viewed from a plan view. The shape of the stack SS will be described in more detail below. Lower insulating layers 105 may be disposed between the substrate 100 and the stack SS. The lower insulating layers 105 may be, for example, a silicon oxide layer. The lower insulating layers 105 may have thinner than the insulating layers 110.

A plurality of channel structures CS may be electrically connected to the substrate 100 through the stack SS. As illustrated in FIG. 2B, the channel structures CS may be spaced apart from each other and be arranged in the first direction D1, when viewed in a plan view. The channel structures CS may be arranged in the first direction D1 to form a first row R1 and a second row R2. The second row R2 may be positioned in an opposite direction of the second direction D2 with respect to the first row R1. In other words, the first row R1 and second row R2 may be spaced apart from each other in the second direction D2. Further, each of the channel structures CS of the first row R1 may not be overlapped with the channel structures CS of the second row R2 in the second direction D2. For example, the first row R1 may be shifted from the second row R2 in the first direction D1 by half a pitch of the channel structures CS. In other words, the channel structures CS of the first row R1 and the channel structures CS of the second row R2 may be alternately arranged in the first direction D1 to form a zigzag arrangement.

Each of the channel structures CS may include semiconductor patterns 130 and 135, which penetrate the stack SS and are electrically connected to the substrate 100. The semiconductor patterns 130 and 135 may include a first semiconductor pattern 130 and a second semiconductor pattern 135. The first semiconductor pattern 130 may be provided to cover an inner side surface of the stack SS. The first semiconductor pattern 130 may be shaped like a hollow pipe or macaroni whose top and bottom are open. The first semiconductor pattern 130 may be spaced apart from and not be in contact with the substrate 100. The second semiconductor pattern 135 may be shaped like a pipe or macaroni whose bottom is closed. An inner space of the second semiconductor pattern 135 may be filled with a vertical insulating pattern 150. The second semiconductor pattern 135 may be in contact with an inner side surface of the first semiconductor pattern 130 and the substrate 100.

The semiconductor patterns 130 and 135 may include a semiconductor material. As an example, the semiconductor patterns 130 and 135 may contain silicon (Si), germanium (Ge), or any mixture thereof and be a doped or intrinsic semiconductor layer. Here, the semiconductor patterns 130 and 135 may have a single-crystalline, amorphous, or polycrystalline crystal structure. The first and second semiconductor patterns 130 and 135 may be in an undoped state or be doped to have the same conductivity type as the substrate 100.

Conductive pads 160 may be provided on the channel structures CS, respectively. The conductive pad 160 may have a top surface, which is substantially coplanar with that of the stack SS, the conductive pad 160 may have a bottom surface, which is in direct contact with the semiconductor patterns 130 and 135. The vertical insulators 140 may be disposed between the conductive pad 160 and the insulating layers 110 adjacent thereto. The conductive pad 160 may be a doped region or may include a conductive material.

The stack SS will be described in more detail hereinafter. The gate electrodes 155 of the stack SS may be stacked in a third direction D3 that is perpendicular to both of the first and second directions D1 and D2. The gate electrodes 155 may be separated from each other by the insulating layers 110 disposed between the gate electrodes 155.

In example embodiments, the lowermost ones of the gate electrodes 155 of the stack SS may serve as gate electrodes for the ground selection transistors GST described with reference to FIG. 1. The uppermost ones of the gate electrodes 155 of the stack SS may serve as gate electrodes for the string selection transistors SST described with reference to FIG. 1. The others of the gate electrodes 155 may serve as gate electrodes for the memory cell transistors MCT described with reference to FIG. 1.

The vertical insulators 140 may be interposed between the stack SS and the channel structures CS. Each of the vertical insulators 140 may be shaped like a hollow pipe or macaroni whose top and bottom are open. In example embodiments, the vertical insulators 140 may be in contact with the substrate 100.

The vertical insulators 140 may include a memory element for realizing FLASH memory devices. In other words, the vertical insulators 140 may include a charge storing layer (not shown) for the FLASH memory device. Alternatively, the vertical insulators 140 may include a thin layer capable of storing data (e.g., a phase changeable layer or a variable resistance layer). In example embodiments, the vertical insulators 140 may include a charge storing layer and a tunnel insulating layer (not shown) sequentially stacked. However example embodiments are not limited thereto. For example, the vertical insulators 140 may further include a blocking insulating layer (not shown) interposed between the charge storing layer and the gate electrodes 155. Also, the vertical insulators 140 may include a capping layer (not shown) interposed between the channel structures CS and the insulating layers 110.

The charge storing layer may include at least one of a silicon nitride layer, a silicon oxynitride layer, a silicon-rich nitride layer, a nano-crystalline silicon layer, or a laminated trap layer. The tunnel insulating layer may include a material having an energy band gap greater than that of the charge storage layer. As an example, the tunnel insulating layer may include a silicon oxide layer. The blocking insulating layer may include a material having an energy band gap greater than that of the charge storing layer. As an example, the blocking insulating layer may include a silicon oxide layer, a silicon nitride layer, and/or a silicon oxynitride layer. The capping layer may be at least one of a silicon layer, a silicon oxide layer, a polysilicon layer, a silicon carbide layer, or a silicon nitride layer but may be selected to include a different material from the insulating layers 110. Also, the capping layer may be a high-k dielectric (e.g., tantalum oxide ($Ta_2O_5$), titanium oxide ($TiO_2$), hafnium oxide ($HfO_2$), and/or zirconium oxide ($ZrO_2$)).

Horizontal insulators 180 may be interposed between the gate electrodes 155 and the insulating layers 110 to cover top and bottom surfaces of the gate electrodes 155. The horizontal insulators 180 may also be interposed between the gate electrodes 155 and the channel structures CS. In example embodiments, the vertical insulators 140 may be interposed between the channel structures CS and the horizontal insulators 180.

The horizontal insulators 180 may be formed of a single layer or a plurality of layers. In example embodiments, the horizontal insulators 180 may include a blocking insulating layer constituting memory cell transistors of a charge-trap type FLASH memory device. In example embodiments, the horizontal insulators 180 may include a plurality of blocking insulating layers (not shown). In example embodiments, the horizontal insulators 180 may include a charge storing layer (not shown) and a blocking insulating layer (not shown) constituting the memory cell transistors of the charge-trap type FLASH memory device.

Referring to FIG. 2B, the stack SS may have a first sidewall SW1 extending parallel to the first direction D1 and a second sidewall SW2 opposite to the first sidewall SW1. The first sidewall SW1 may have first recessed portions S1 and first protruding portions P1, and the second sidewall SW2 may have second recessed portions S2 and second protruding portions P2.

When viewed in a plan view, each of the first recessed portions S1 may be positioned between an adjacent pair of the channel structures CS of the first row R1 to have a profile recessed toward a first region A1. Each of the second recessed portions S2 may be positioned between an adjacent pair of the channel structures CS of the second row R2 to have a profile recessed toward a second region A2. In other words, each of the first and second recessed portions S1 and S2 may be a recessed region of the stack SS, which is formed on the first or second sidewall SW1 or SW2. Each of the first recessed portions S1 may have a width WS1, which is measured along the first direction D1 and decreases in a direction toward the first region A1. Each of the second recessed portions S2 may have a width WS2, which is measured along the first direction D1 and decreases in a direction toward the second region A2.

When viewed in a plan view, the first protruding portions P1 may be protruded from the first sidewall SW1 to enclose the channel structures CS of the first row R1. The second protruding portions P2 may be protruded from the second sidewall SW2 to enclose the channel structures CS of the second row R2. In other words, the first protruding portions P1 may be positioned between and defined by adjacent pairs of the first recessed portions S1. The second protruding portions P2 may be positioned between and defined by adjacent pairs of the second recessed portions S2.

In example embodiments, when viewed in a plan view, each of the first protruding portions P1 may be a triangular portion that is disposed to enclose a corresponding one of the channel structures CS of the first row R1. When viewed in a plan view, each of the second protruding portions P2 may be a triangular portion that is disposed to enclose a corresponding one of the channel structures CS of the second row R2. Accordingly, the stack SS may be a structure elongated along the first direction D1 in a zigzag manner.

The first protruding portions P1, the first recessed portions S1, the second protruding portions P2, and the second recessed portions S2 may be extended from top to bottom of the stack SS. Accordingly, each of the gate electrodes 155 of the stack SS may have the first protruding portions P1 and the first recessed portions S1, which are formed on the first sidewall SW1 thereof, and the second protruding portions P2 and the second recessed portions S2, which are formed on the second sidewall SW2 thereof. Each of the insulating layers 110 of the stack SS may also have the first protruding portions P1 and the first recessed portions S1, which are formed on the first sidewall SW1 thereof, and the second protruding portions P2 and the second recessed portions S2, which are formed on the second sidewall SW2 thereof.

The shape of the stack SS will be described in more detail with reference to FIG. 2B. According to example embodiments of inventive concepts, the stack SS may be a structure elongated along the first direction D1 in a zigzag manner. When compared with a comparative stack CSS linearly extending parallel to the first direction D1, the stack SS may have a smaller occupying area, when viewed in a plan view.

Hereinafter, a first straight line L1 may be defined as a line connecting a center of each channel structure of the first row R1 to an end of a corresponding one of the first protruding portions P1 adjacent thereto. The first straight line L1 may be a straight line extending from the center of each channel structure of the first row R1 to a point of the first sidewall SW1, which is positioned at the same level, in the second direction D2. Furthermore, a second straight line L2 may be defined as a line connecting the center of each channel structure of the first row R1 to a point on a side surface of the first protruding portions P1. A third straight line L3 may be defined as a line that is extended from the second straight line L2 to connect the center of each channel structure of the first row R1 to a point on a side surface of the comparative stack CSS. In this case, the first straight line L1, the third straight line L3, and the side surface of the comparative stack CSS may form a right triangle. Suppose that the first straight line L1 has a first length (hereinafter, 1) and an angle between the second and third straight lines L2 and L3 and the first straight line L1 is $\theta$. The angle $\theta$ may range from $-45°$ to $45°$. Then, a length of the third straight line L3 may be given by dividing a length of the first straight line L1 by $\cos \theta$ ($L3=L1/\cos \theta$). As illustrated in FIG. 2B, a length of the second straight line L2 is shorter than that of the third straight line L3, because the width WS1 of each of the first recessed portions S1 decreases in the direction toward the first region A1. In the case of the comparative stack CSS, a distance between each channel structure of the first row R1 and a point on a side surface of the comparative stack CSS is given by the length of the third straight line L3 (i.e., $L1/\cos \theta$). By contrast, according to example embodiments of inventive concepts, a distance between each channel structure of the first row R1 and a point on a side surface of the stack SS is the length of the second straight line L2 and is shorter than the length of the third straight line L3. In other words, according to example embodiments of inventive concepts, it is possible to reduce a distance from the first sidewall SW1 of the stack SS to each of the channel structures CS of the first row R1, compared to that of the comparative stack CSS. Such a geometrical feature between the channel structures CS of the first row R1 and the first recessed portions S1 can be found from the channel structures CS of the second row R2 and the second recessed portions S2. In other words, according to example embodiments of inventive concepts, it is possible to reduce a distance from the second sidewall SW2 of the stack SS to each of the channel structures CS of the second row R2, compared to that of the comparative stack CSS.

To increase an integration density of a three-dimensional semiconductor memory device, deposition thicknesses of the gate electrodes 155 and the insulating layers 110 may be reduced. However, such a reduction in deposition thicknesses of the gate electrodes 155 and the insulating layers 110 may lead to a reduction in height of memory cells and a cell dissolution phenomenon. As an example, the cell dissolution phenomenon may occur when the gate electrodes 155 are formed. In detail, the gate electrodes 155 may be formed by depositing a metal layer between the insulating layers 110, but if the height of the memory cell is reduced, there may be a limit in supplying precursor materials for the metal layer into regions between the insulating layers 110 and this may lead to a non-conformal deposition of the metal layer. Especially, the shorter a distance from the channel structures CS, the longer a distance from an outer sidewall of the insulating layers 110, which is an entrance for supplying the precursor materials, and thus, there may be a difficulty in depositing the metal layer in regions adjacent to the channel structures CS. Accordingly, a seam or void may be formed in the metal layer or in the gate electrodes 155, which is formed from the metal layer. Here, the seam or void may allow extra active gas (e.g., fluorine gas or the like) to remain or be contained therein. The extra active gas supplied during a fabrication process may result in dissolution or collapse of the gate electrodes 155.

By contrast, for the stack SS according to example embodiments of inventive concepts, it is possible to reduce a distance from the first sidewall SW1 of the stack SS to the channel structures CS of the first row R1, and thus, the precursor materials can be more effectively supplied to the channel structures CS, when the metal layer is deposited. Accordingly, the metal layer can be formed to more completely fill gap regions between the insulating layers 110, without seam or void. Moreover, the gate electrodes 155 formed from the metal layer can be formed to completely fill the gap regions between the insulating layers 110 without seam or void. In sum, according to example embodiments of inventive concepts, it is possible to limit and/or suppress the cell dissolution phenomenon by changing the shape of the stack SS, without performing any additional process.

According to example embodiments of inventive concepts, since the stack SS is a structure elongated along the first direction D1 in a zigzag manner, the first and second sidewalls SW1 and SW2 may have an increased surface area, compared with that of the comparative stack CSS with a simple line shape. Furthermore, the first and second recessed portions S1 and S2 in each of the first and second sidewalls SW1 and SW2 may allow a stacking-induced pressure to be effectively distributed. Accordingly, it is possible to improve collapse or leaning of the stack SS, which may occur when the number of layers constituting the stack SS is increased. In other words, the stack SS can be formed to have improved structural stability.

Furthermore, referring back to FIG. 2B, the stack SS according to example embodiments of inventive concepts may be spaced apart from other stack SS by a specific distance PSS. The distance PSS may be fixedly given according to a design rule. In this light, although not shown in FIG. 2B, the comparative stack CSS may be spaced apart from other comparative stack CSS by the specific distance PSS. Accordingly, a plurality of stacks SS according to example embodiments of inventive concepts may be provided to occupy a reduced planar area, compared to that of the comparative stack CSS. This makes it possible to further increase an integration density of the semiconductor device.

Referring to FIGS. 2A through 2C, the bit lines BL may be formed on the stack SS to cross the stack SS. The bit lines BL may extend parallel to the second direction D2 and may be spaced apart from each other in the first direction D1, when viewed in a plan view. Each of the channel structures CS of the first row R1 may not be overlapped with the channel structures CS of the second row R2 in the second direction D2. Accordingly, one of the channel structures CS of the first row R1 and one of the channel structures CS of the second row R2 positioned adjacent thereto may be connected to different ones of the bit lines BL. The bit lines BL may be coupled to the conductive pads 160 via contact plugs 170.

Figure 3A:
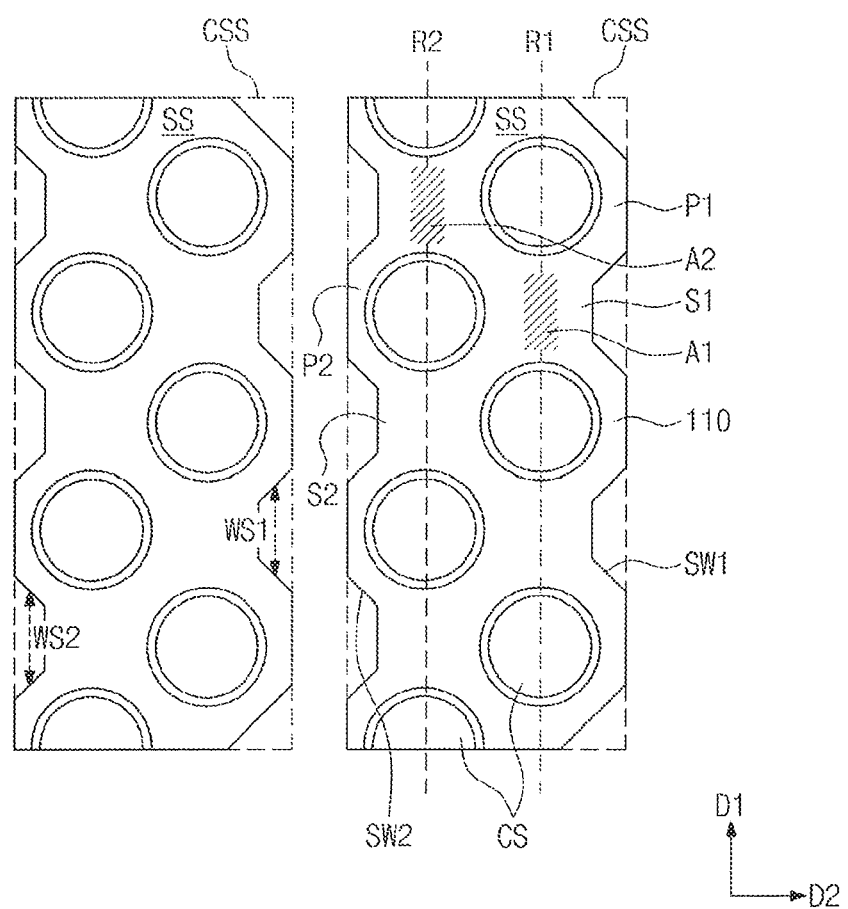
FIGS. 3A and 3B are plan views illustrating a three-dimensional semiconductor memory device according to other example embodiments of inventive concepts.
Figure 3B:
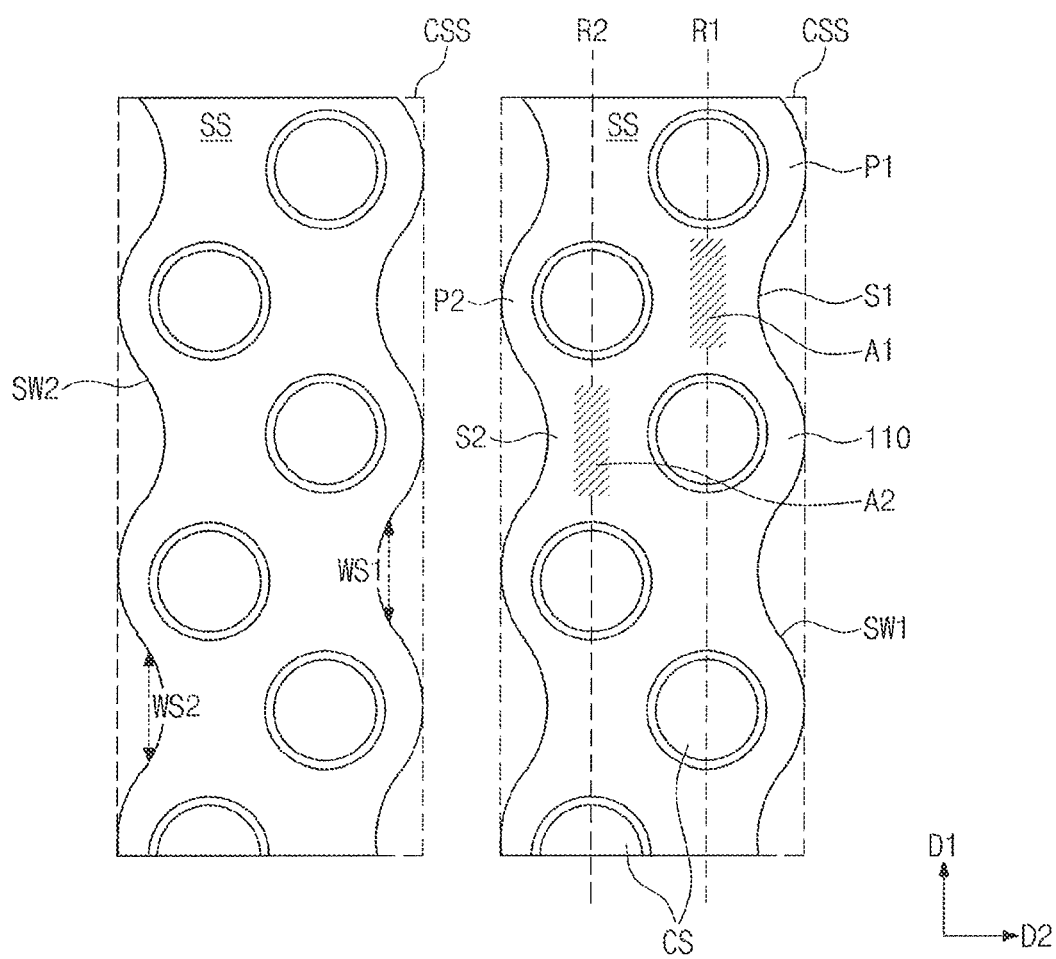

FIGS. 3A and 3B are plan views illustrating a three-dimensional semiconductor memory device according to example embodiments of inventive concepts. Semiconductor memory devices according to FIGS. 3A and 3B may be configured to have substantially the same features as that of the semiconductor memory device described with reference to FIGS. 2A through 2C, except for a difference in shape of the stack SS in a plan view.

Referring to FIG. 3A, the stack SS may be provided to have first recessed portions S1 and first protruding portions P1 on the first sidewall SW1 and second recessed portions S2 and second protruding portions P2 on the second sidewall SW2. When viewed in a plan view, each of the first protruding portions P1 and the second protruding portions P2 may have a trapezoidal shape.

Referring to FIG. 3B, the stack SS may be provided to have first recessed portions S1 and first protruding portions P1 on the first sidewall SW1 and second recessed portions S2 and second protruding portions P2 on the second sidewall SW2. When viewed in a plan view, each of the first protruding portions P1 and the second protruding portions P2 may have a semi-circular shape. Furthermore, when viewed in a plan view, the first protruding portions P1 may be connected to the first recessed portions S1, the first sidewall SW1 may have a wavy shape.

In other words, the first and second protruding portions P1 and P2 may be formed to have a shape, allowing each of the first and second recessed portions S1 and S2 to have a decreasing width (e.g., WS1 or WS2) in a direction toward the first or second region A1 or A2, and if this feature is satisfied, the shapes of the first and second protruding portions P1 and P2 can be variously changed. For the stacks SS illustrated in FIGS. 3A and 3B, it is possible to reduce a distance between the first sidewall SW1 and the channel structures CS of the first row R1 and a distance between the second sidewall SW2 and the channel structures CS of the second row R2, compared with that of the above comparative stack CSS. That is, by changing the shape of the stack SS, without performing any additional process, it is possible to reduce and/or suppress the cell dissolution phenomenon and improve structural stability of the stack SS.

Figure 4A:
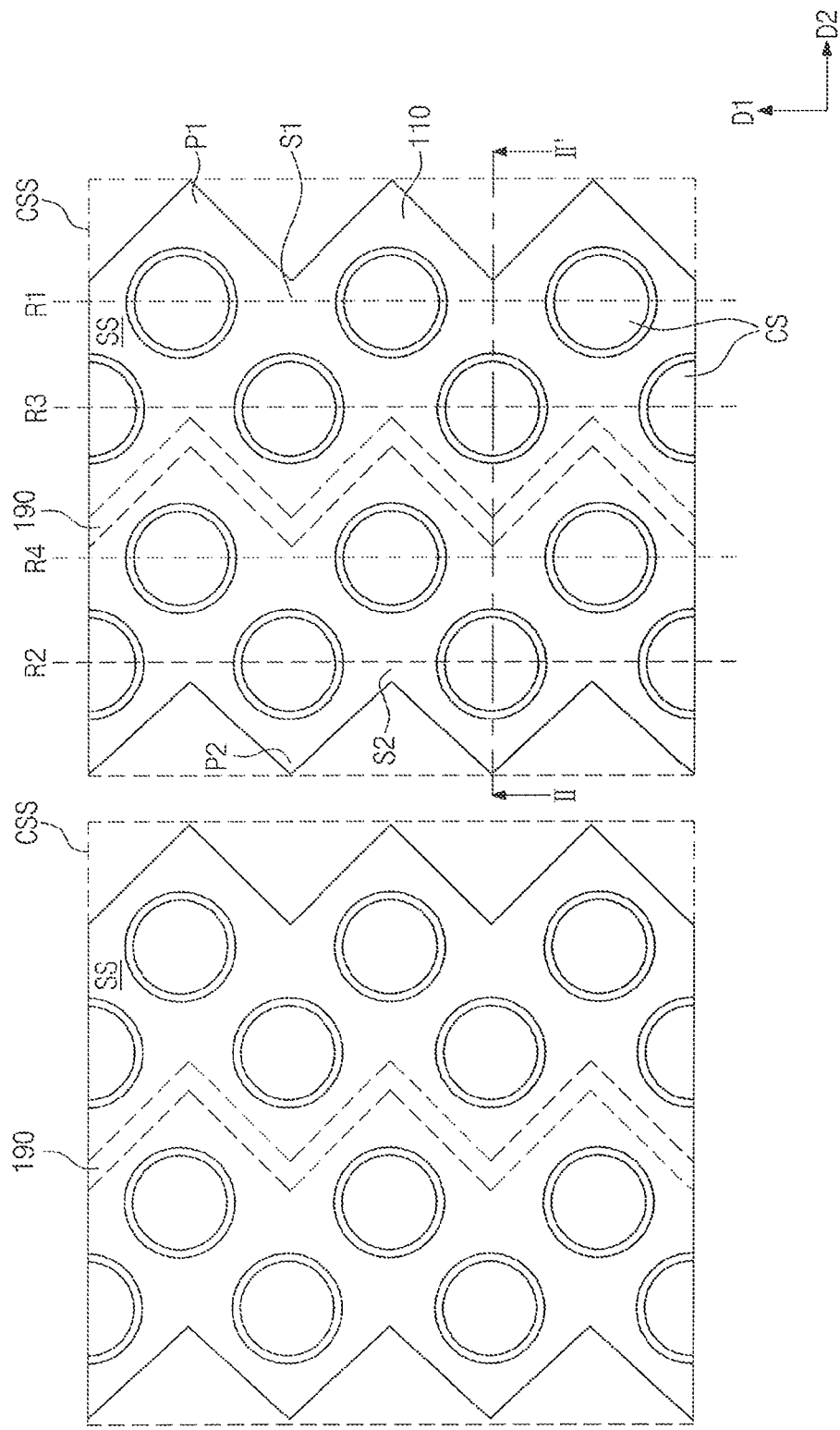
FIG. 4A is a plan view illustrating a three-dimensional semiconductor memory device according to still other example embodiments of inventive concepts.
Figure 4B:
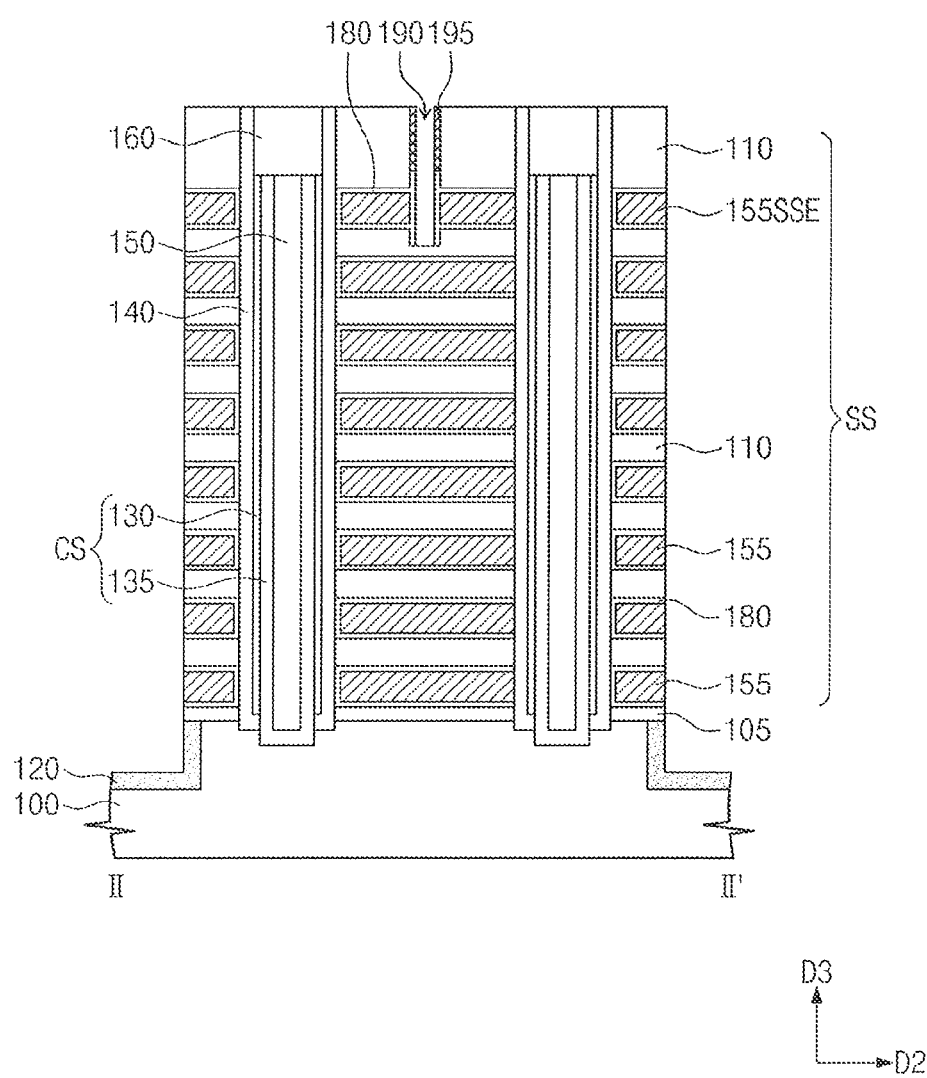
FIG. 4B is a sectional view taken along line II-IP of FIG. 4A.

FIG. 4A is a plan view illustrating a three-dimensional semiconductor memory device according to example embodiments of inventive concepts. FIG. 4B is a sectional view taken along line II-II' of FIG. 4A.

Referring to FIGS. 4A and 4B, a stack SS of a semiconductor memory device may further include channel structures CS, which are disposed spaced apart from each other in the first direction D1 and form a third row R3 and a fourth row R4. In more detail, the third row R3 may be disposed adjacent to the first row R1 in an opposite direction of the second direction D2. The fourth row R4 may be positioned adjacent to the second row R2 in the second direction D2. Further, each of the channel structures CS of the first row R1 may be overlapped with a corresponding one of the channel structures CS of the fourth row R4 in the second direction D2. Each of the channel structures CS of the first row R1 may not be overlapped with the channel structures CS of the third row R3 in the second direction D2. In other words, the channel structures CS of the first and third rows R1 and R3 may be alternately arranged in the first direction D1 to form a zigzag arrangement. Similarly, each of the channel structures CS of the second row R2 may be overlapped with a corresponding one of the channel structures CS of the third row R3 in the second direction D2. Each of the channel structures CS of the second row R2 may not be overlapped with the channel structures CS of the fourth row R4 in the second direction D2. In other words, the channel structures CS of the second and fourth rows R2 and R4 may be alternately arranged in the first direction D1 to form a zigzag arrangement. Here, each of the channel structures CS of the first row R1 may not be overlapped with the channel structures CS of the second row R2 in the second direction D2.

The uppermost ones of the gate electrodes 155 of the stack SS may serve as a plurality of string selection electrodes 155SSE. The string selection electrodes 155SSE may be positioned at the same level from the top surface of the substrate 100 and may be spaced apart from each other in the second direction D2. But example embodiments of inventive concepts may not be limited thereto. The string selection electrodes 155SSE may be provided at two or more different levels from the top surface of the substrate 100, thereby forming a multi-layered structure.

A cutting region 190 may be formed between the string selection electrodes 155SSE. The cutting region 190 may be a recessed region, which may be filled with an electrode separation pattern (not shown). In other words, the string selection electrodes 155SSE may be spaced apart from each other with the cutting region 190 interposed therebetween and may be electrically separated from each other by the electrode separation pattern.

The horizontal insulators 180 may be interposed between the gate electrodes 155 and the insulating layers 110 to cover top and bottom surfaces of the gate electrodes 155. The horizontal insulators 180 may also be interposed between the gate electrodes 155 and the channel structures CS. Furthermore, the horizontal insulators 180 may include an extended portion covering an outer sidewall of each of the string selection electrodes 155SSE. In each of the string selection electrodes 155SSE, the outer sidewall may be a sidewall exposed by the cutting region 190. The horizontal insulators 180 may further extend from the outer sidewall in the third direction D3 to cover an inner sidewall of the cutting region 190.

Remaining sacrificial spacers 195 may be provided on the uppermost one of the insulating layers 110. The remaining sacrificial spacer 195 may be provided on the extended portion of the horizontal insulators 180 covering the outer sidewall of the string selection electrodes 155SSE. The remaining sacrificial spacer 195 may include a dielectric material having an etch selectivity with respect to the insulating layers 110. A pair of the remaining sacrificial spacers 195 may be provided on both inner sidewalls, respectively, of the cutting region 190. Each of the remaining sacrificial spacers 195 may be interposed between the uppermost one of the insulating layers 110 and the electrode separation pattern. The pair of the remaining sacrificial spacers 195 may extend parallel to the first direction D1.

Bit lines (not shown) may be formed on the stack SS to cross the stack SS. The bit lines may extend parallel to the second direction D2 and may be spaced apart from each other in the first direction D1. Each of the channel structures CS of the first row R1 may be located at the same position as a corresponding one of the channel structures CS of the fourth row R4 in the second direction D2, and thus, they may be connected in common to the same bit line. Each of the channel structures CS of the second row R2 may be located at the same position as a corresponding one of the channel structures CS of the third row R3 in the second direction D2, and thus, they may be connected in common to the same bit line.

Since the string selection electrodes 155SSE are spaced apart from each other by the cutting region 190 and the electrode separation pattern, it is possible to apply different voltages to the string selection electrodes 155SSE, respectively. Accordingly, it is possible to selectively control switching operations of the string selection transistors SST with the string selection electrodes 155SSE (for example, during a programming operation of the three-dimensional semiconductor memory device).

In the case where, like in the stack SS described with reference to FIGS. 4A and 4B, the channel structures CS are arranged to form a plurality of rows in the second direction D2, each stack SS may have an increased planar area, compared with that of the previous example embodiments described with reference to FIGS. 2A through 2C. This may be true for the comparative stack CSS, which is formed to have a straight line shape parallel to the first direction D1. In this case, similar to that described above, the seam or void may be more easily formed, when a metal layer is deposited between the insulating layers 110. This is because the precursor materials should be further moved to form the metal layer. In particular, when viewed in a plan view, since the comparative stack CSS has a larger area than that of the stack SS, the cell dissolution phenomenon may be more likely to occur. Since the stack SS according to example embodiments of inventive concepts has a zigzag pattern shape, it is possible to reduce a moving distance of the precursor materials used to form the metal layer, compared with that of the comparative stack CSS. Accordingly, the cell dissolution phenomenon can be reduced, in example embodiments of inventive concepts.

The semiconductor memory devices according to FIGS. 4A and 4B may be configured to have substantially the same features as that of the semiconductor device described with reference to FIGS. 2A through 2C, except for the above differences.

FIGS. 5A through 5H are sectional views illustrating a method of fabricating a three-dimensional semiconductor memory device, according to example embodiments of inventive concepts. FIGS. 5A through 5H are sectional views corresponding to ling I-I' of FIG. 2B.

Figure 5A:
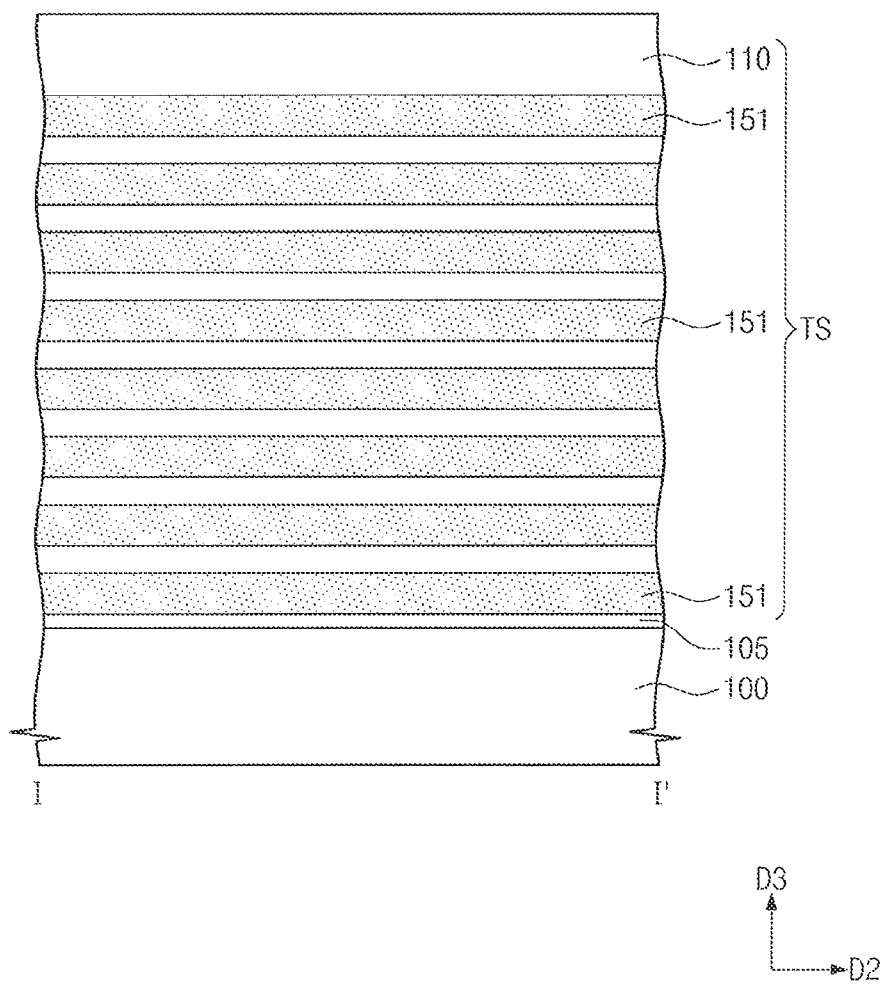
FIGS. 5A through 5H are sectional views illustrating a method of fabricating a three-dimensional semiconductor memory device, according to example embodiments of inventive concepts.

Referring to FIG. 5A, sacrificial layers 151 and insulating layers 110 may be alternately and repeatedly deposited on a substrate 100 to form a layered structure TS. The substrate 100 may be, for example, a silicon wafer, a germanium wafer, or a silicon-germanium wafer.

The sacrificial layers 151 may be formed of or include a material, which can be etched with a high etch selectivity with respect to the insulating layers 110. In example embodiments, the sacrificial layers 151 and the insulating layers 110 may be formed in such a way that they are etched to have a high etch selectivity in a wet etching process using chemical solution and a low etch selectivity in a dry etching process using etching gas.

In example embodiments, the sacrificial layers 151 may be formed to have substantially the same thickness. However, example embodiments are not limited thereto. For example, the lowermost and uppermost ones of the sacrificial layers 151 may be formed to be thicker than the others therebetween. The insulating layers 110 may be formed to have substantially the same thickness, but in example embodiments, at least one of the insulating layers 110 may be formed to have a thickness different from the others.

The sacrificial layers 151 and the insulating layers 110 may be deposited using, for example, a thermal chemical vapor deposition (Thermal CVD) process, a plasma-enhanced CVD process, a physical CVD process, or an atomic layer deposition (ALD) process.

In example embodiments, the sacrificial layers 151 and the insulating layers 110 may be formed of insulating materials having an etch selectivity with respect to each other. For example, the sacrificial layers 151 may be at least one of a silicon layer, a silicon oxide layer, a silicon carbide layer, a silicon oxynitride layer, or a silicon nitride layer. The insulating layers 110 may be at least one of a silicon layer, a silicon oxide layer, a silicon carbide layer, a silicon oxynitride layer, or a silicon nitride layer, but it may be formed of a material selected to be different from the sacrificial layers 151. The sacrificial layers 151 and the insulating layers 110 may be formed of materials that are different from each other. As an example, the sacrificial layers 151 may be formed of a silicon nitride layer, and the insulating layers 110 may be formed of a silicon oxide layer. However example embodiments are not limited thereto. For example, the sacrificial layers 151 may be formed of a conductive material, and the insulating layers 110 may be formed of an insulating material.

Furthermore, a lower insulating layer 105 may be formed between the substrate 100 and the layered structure TS. For example, the lower insulating layer 105 may be a silicon oxide layer, which may be formed by a thermal oxidation process. Alternatively, the lower insulating layer 105 may be a silicon oxide layer, which may be formed by a deposition technique. The lower insulating layer 105 may be thinner than the sacrificial layers 151 and the insulating layers 110 thereon.

Figure 5B:
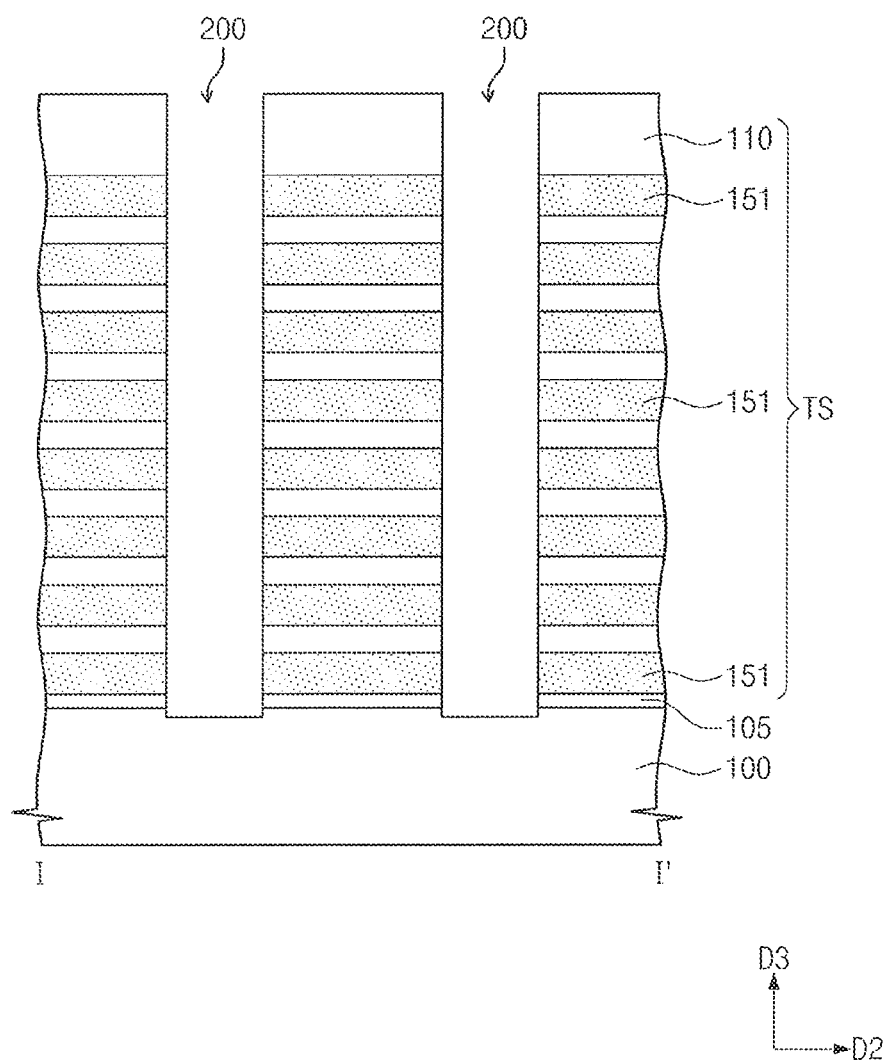

Referring to FIG. 5B, channel holes 200 may be formed through the layered structure TS to expose the substrate 100. When viewed in a plan view, the channel holes 200 may be arranged along the first direction D1. In example embodiments, the channel holes 200 may be arranged in the first direction D1 to form a first row R1 and a second row R2. The second row R2 may be positioned in an opposite direction of the second direction D2 with respect to the first row R1. In other words, the first row R1 and second row R2 may be spaced apart from each other in the second direction D2. Further, each of the channel holes 200 of the first row R1 may not be overlapped with the channel holes 200 of the second row R2 in the second direction D2. In other words, the channel holes 200 of the first and second rows R1 and R2 may be alternately arranged in the first direction D1 to form a zigzag arrangement (for example, see FIG. 2B).

The forming of the channel holes 200 may include first mask patterns on the layered structure TS to have openings defining shapes and positions of the channel holes 200 and etching the layered structure TS using the first mask patterns as an etch mask. The first mask patterns may be formed of a material having an etch selectivity with respect to the sacrificial layers 151 and the insulating layers 110. During the etching process, the top surface of the substrate 100 may be over-etched or recessed. As a result of the etching process, a lower width of the channel hole 200 may be smaller than an upper width of the channel hole 200. Thereafter, the first mask patterns may be removed.

Figure 5C:
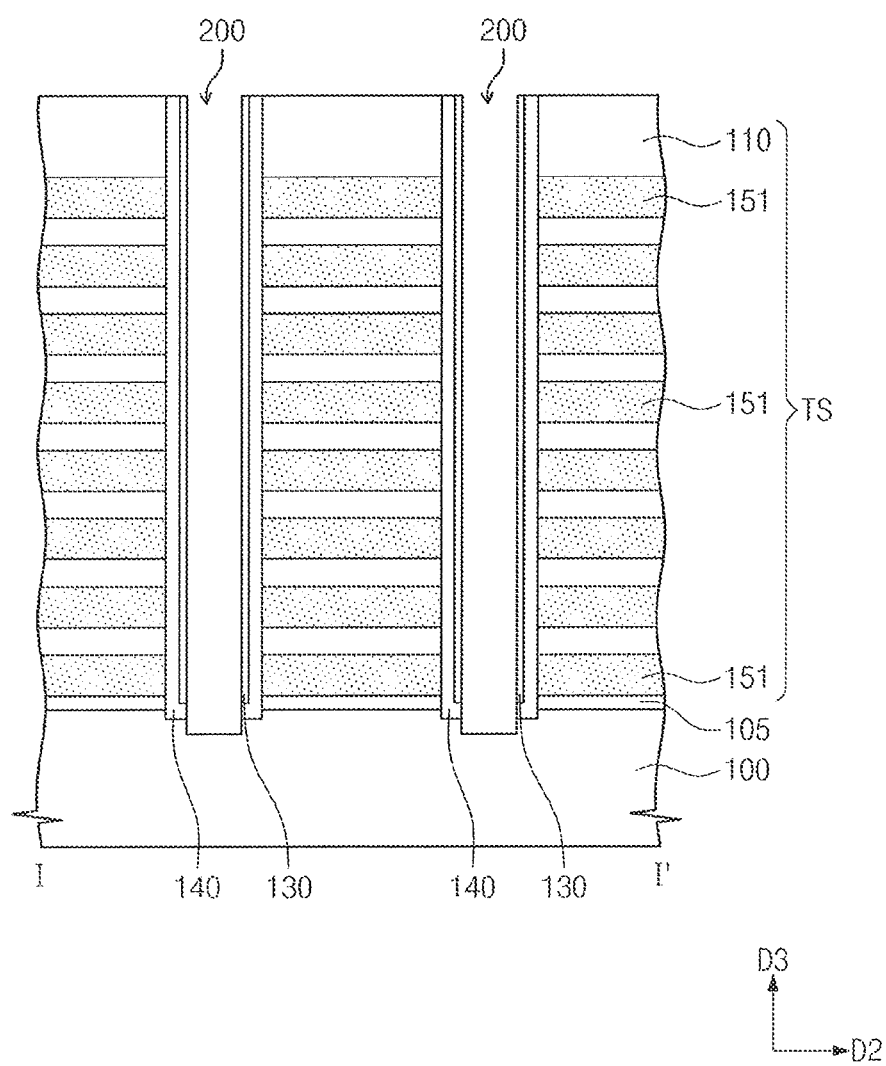

Referring to FIG. 5C, the vertical insulators 140 and the first semiconductor patterns 130 may be formed to cover inner surfaces of the channel holes 200 and expose the substrate 100. For example, a vertical insulating layer and a first semiconductor layer may be sequentially formed on the structure provided with the channel holes 200 to cover inner surfaces of the channel holes 200. The vertical insulating layer and the first semiconductor layer may be formed to partially fill the channel holes 200. A sum in thickness of the vertical insulating layer and the first semiconductor layer may be smaller than half a width of each of the channel holes 200. In other words, the channel holes 200 may not be completely filled with the vertical insulating layer and the first semiconductor layer. Furthermore, the vertical insulating layer may be formed to cover the top surface of the substrate 100 exposed by the channel holes 200. The vertical insulating layer may include a plurality of thin films, which may be formed by, for example, one of PE-CVD, physical CVD, and ALD processes.

The vertical insulating layer may include a charge storing layer serving as a memory element of the FLASH memory device. As an example, the charge storing layer may be a trap insulating layer or an insulating layer with conductive nanodots. Alternatively, the vertical insulating layer may include a phase changeable layer or a variable resistance layer.

In example embodiments, although not shown in the drawings, the vertical insulating layer may include a blocking insulating layer, a charge storing layer, and a tunnel insulating layer sequentially stacked. The blocking insulating layer may be formed to cover sidewalls of the sacrificial layers 151 and the insulating layers 110 and the top surface of the substrate 100 exposed by the channel holes 200. The blocking insulating layer may include at least one of silicon oxide or high-k dielectrics. The charge storing layer may include a trap insulating layer or an insulating layer with conductive nano dots. For example, the charge storing layer may include at least one of a silicon nitride layer, a silicon oxynitride layer, a silicon-rich nitride layer, a nanocrystalline silicon layer, or a laminated trap layer. The tunnel insulating layer may be formed of at least one of insulating layers, whose band gaps are greater than that of the charge storing layer. As an example, the tunnel insulating layer may be a silicon oxide layer.

The first semiconductor layer may be formed on the vertical insulating layer. In example embodiments, the first semiconductor layer may be formed by one of ALD or CVD processes and may be formed of a semiconductor material (e.g., a poly silicon layer, a single crystalline silicon layer, or an amorphous silicon layer).

The vertical insulating layer and the first semiconductor layer may be sequentially formed and may be anisotropically etched to expose the substrate 100. Accordingly, the first semiconductor patterns 130 and the vertical insulators 140 may be formed on inner side surfaces of the channel holes 200. Each of the vertical insulators 140 and the first semiconductor patterns 130 may be formed to have a hollow cylindrical shape. The anisotropic etching of the first semiconductor layer and the vertical insulating layer may be performed in an over-etch manner, and thus, the top surface of the substrate 100 may be partially recessed.

Furthermore, the anisotropic etching of the first semiconductor layer and the vertical insulating layer may be performed to expose the top surface of the layered structure TS. Accordingly, the vertical insulators 140 and the first semiconductor patterns 130 may be locally formed in the channel holes 200.

Figure 5D:
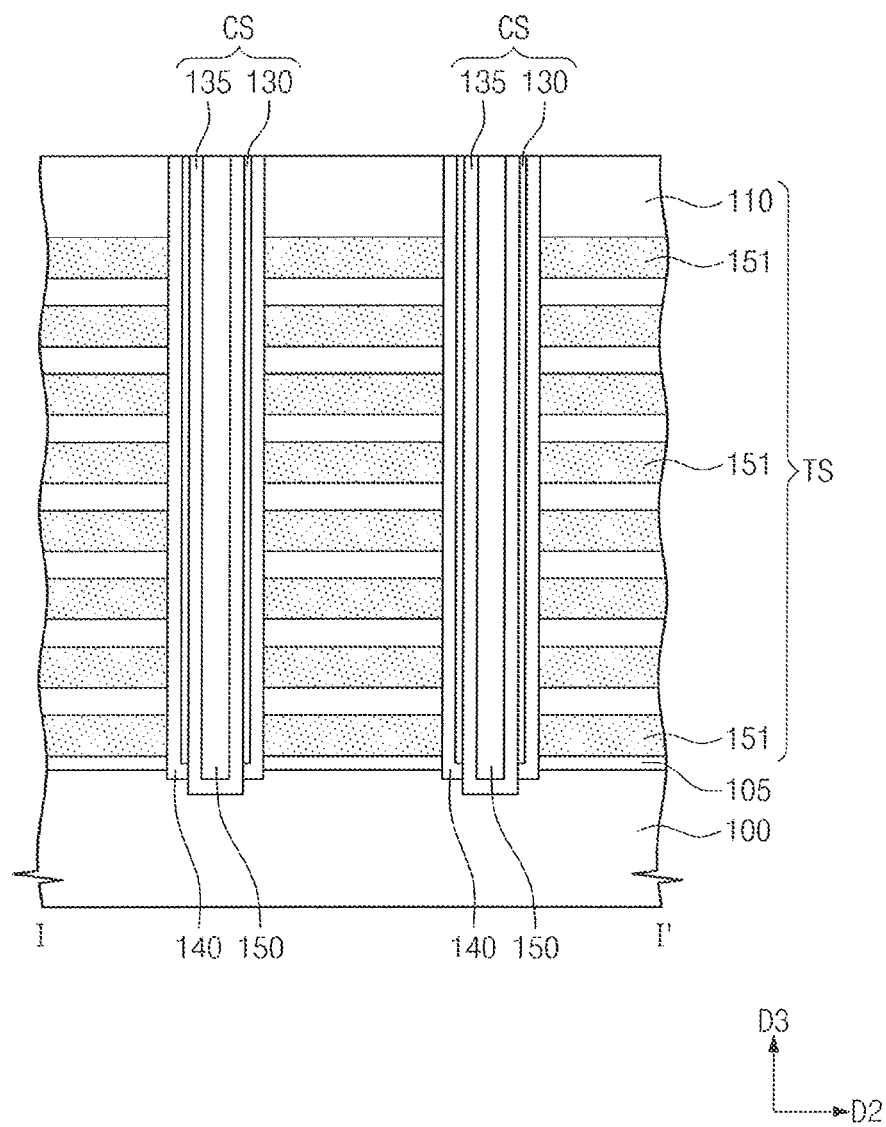

Referring to FIG. 5D, the second semiconductor patterns 135 and the vertical insulating patterns 150 may be formed on the structure provided with the vertical insulators 140 and the first semiconductor pattern 130. In detail, a second semiconductor layer and an insulating layer may be sequentially formed on the resulting structure described with reference to FIG. 5C. The second semiconductor layer may be too thin to fill the whole spaces of the channel holes 200 and may be conformally formed in the channel holes 200. The second semiconductor layer may be formed by one of ALD or CVD processes and may be formed of a semiconductor material (e.g., a poly silicon layer, a single crystalline silicon layer, or an amorphous silicon layer). The insulating layer may be formed to completely fill the channel holes 200. The insulating layer may be formed of or include one of insulating materials and a silicon oxide layer, which may be formed using a spin-on-glass (SOG) process. Thereafter, the second semiconductor layer and the insulating layer may be planarized to expose the top surface of the layered structure TS, and thus, the second semiconductor patterns 135 and the vertical insulating patterns 150 may be locally formed in the channel holes 200.

In the channel holes 200, each of the second semiconductor patterns 135 may be shaped like a pipe or cylinder with a closed bottom or a cup. However example embodiments are not limited thereto. For example, each of the second semiconductor patterns 135 may be shaped a like a solid pillar filling the channel holes 200.

The vertical insulating patterns 150 may be formed to fill the channel holes 200 provided with the second semiconductor pattern 135.

Figure 5E:
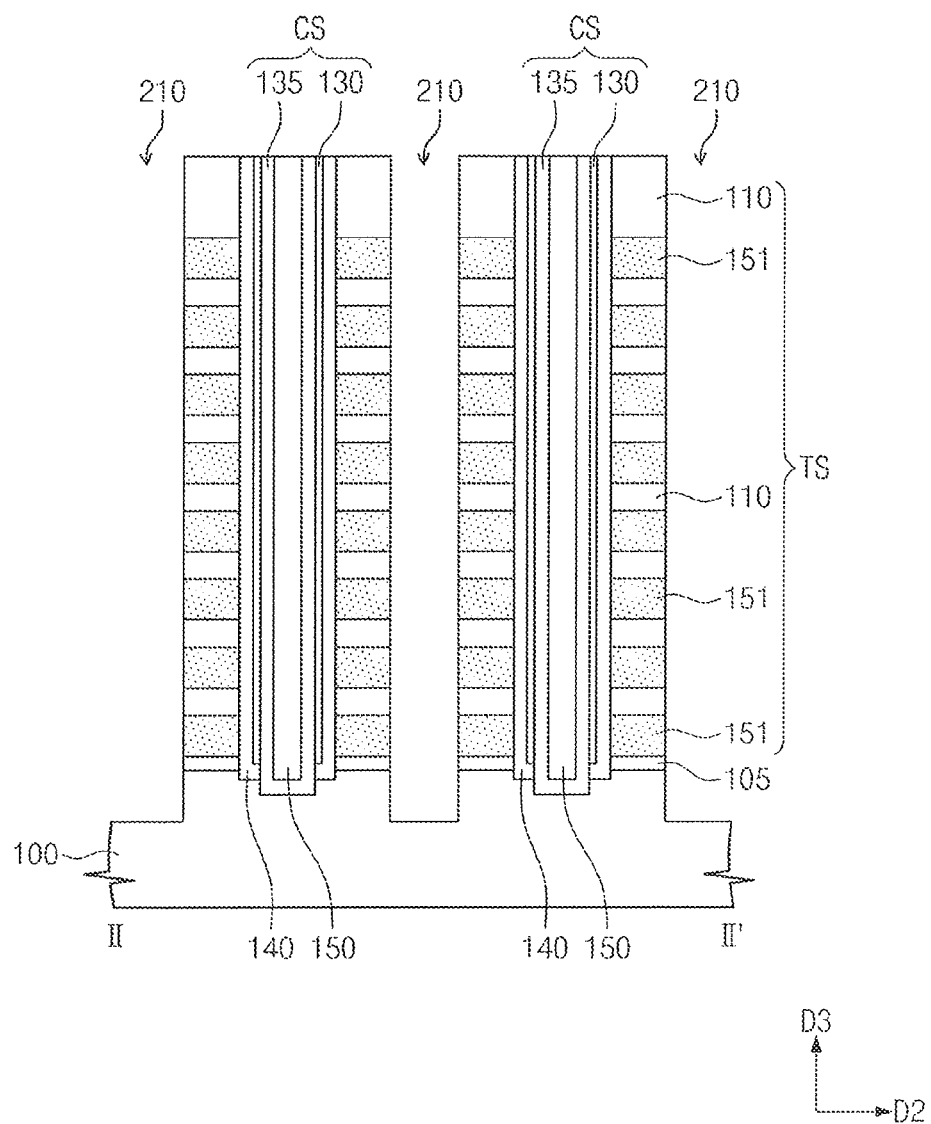

Referring to FIG. 5E, the layered structure TS may be patterned to form trenches 210 exposing the substrate 100. The trenches 210 may be formed parallel to the first direction D1 and may be formed spaced apart from and parallel to the rows of the channel holes 200. In the case where the channel holes 200 forms a plurality of rows, the trenches 210 may be formed at a side of the first row R1 of the channel holes 200 and at a side of the second row R2 of the channel holes 200.

The formation of the trenches 210 may include forming second mask patterns on the layered structure TS to define planar positions of the trenches 210 and etching the layered structure TS using the second mask patterns as an etch mask. The trenches 210 may be formed to expose the sidewalls of the sacrificial layers 151 and the insulating layers 110. When viewed in a plan view, each of the trenches 210 may be a line-shaped structure extending parallel to the first direction D1 and may be formed to expose the top surface of the substrate 100 in a vertical view. Although not shown, in practice, it may be hard to perform the etching process in a completely anisotropic manner, and thus, the trenches 210 may be formed to have a width varying depending on a distance from the substrate 100.

Figure 6:
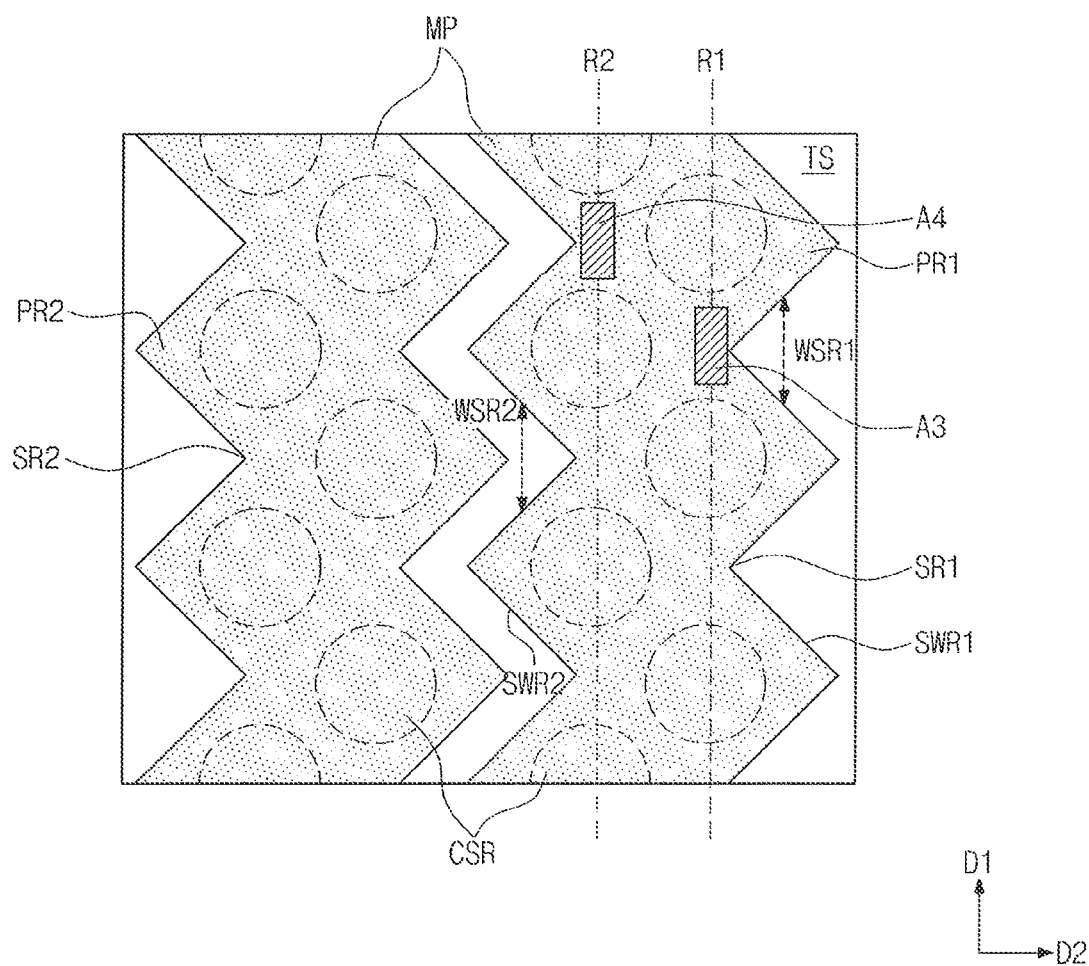
FIG. 6 is a plan view illustrating the second mask patterns formed on the layered structure of FIG. 5E.

FIG. 6 is a plan view illustrating the second mask patterns MP, which are formed on the layered structure TS of FIG. 5E.

Referring to FIG. 6, each of the second mask patterns MP may have a first side SWR1, on which first protruding regions PR1 and first recessed regions SR1 are formed. In addition, each of the second mask patterns MP may have a second side SWR2, which is positioned opposite to the first side SWR1, and on which second protruding regions PR2 and second recessed regions SR2 are formed. A plurality of upper regions CSR may be defined in the second mask pattern MP. The upper regions CSR may vertically overlap with the channel structures CS. The upper regions CSR may constitute first and second rows R1 and R2 in the same manner as the channel structures CS. Each of the first recessed regions SR1 may be positioned between an adjacent pair of the upper regions CSR of the first row R1 to have a profile recessed toward a third region A3. Each of the second recessed regions SR2 may be positioned between an adjacent pair of the upper regions CSR of the second row R2 to have a profile recessed toward a fourth region A4. Each of the first recessed regions SR1 may have a width WSR1, which is measured along the first direction D1 and decreases in a direction toward the third region A3. Each of the second recessed regions SR2 may have a width WSR2, which is measured along the first direction D1 and decreases in a direction toward the fourth region A4.

When viewed in a plan view, the first protruding regions PR1 may be provided to enclose the upper regions CSR of the first row R1 and may be portions protruding from the first side SWR1. The second protruding regions PR2 may be provided to enclose the upper regions CSR of the second row R2 and may be portions protruding from the second side SWR2. In other words, each of the first protruding regions PR1 may be positioned between and defined by an adjacent pair of the first recessed regions SR1. Each of the second protruding regions PR2 may be positioned between and defined by an adjacent pair of the second recessed regions SR2. In other words, each of the second mask patterns MP may be a structure elongated along the first direction D1 in a zigzag manner. The trenches 210 may also be a structure elongated along the first direction D1 in a zigzag manner.

The second mask patterns MP may be used to transfer its planar shape to the stack SS, in a process of patterning the layered structure TS. For example, the stack SS may have the same shape as in the example embodiments previously described with reference to FIGS. 2B, 3, and 4.

Figure 5F:
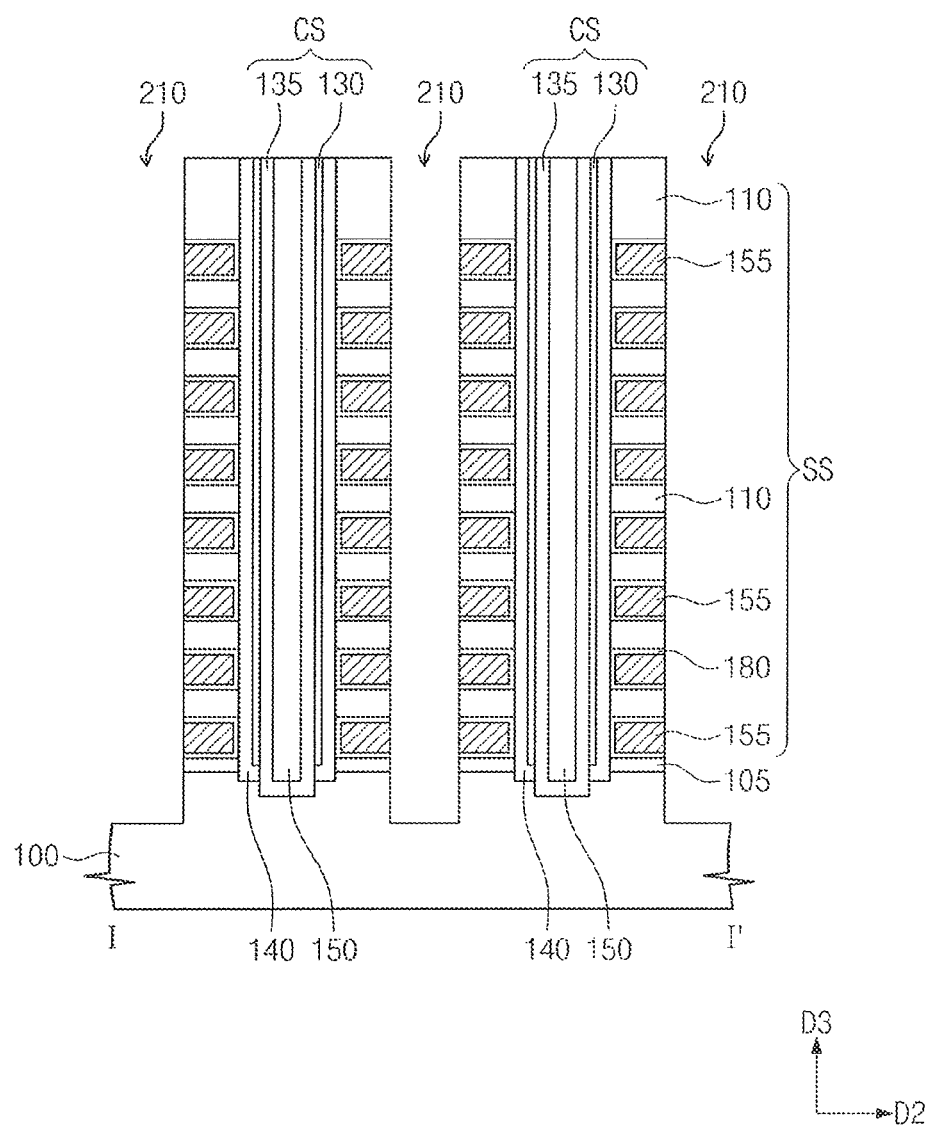

Referring to FIG. 5F, the sacrificial layers 151 exposed by the trenches 210 may be selectively removed to form recess regions. Each of the recess regions may be a gap region laterally extending from the trenches 210 and may be formed to expose sidewalls of the vertical insulators 140.

The horizontal insulators 180 may be formed to partially fill the recess regions. The horizontal insulators 180 may be formed to cover inner surfaces of the recess regions. The gate electrodes 155 may be formed on the horizontal insulators 180 to fill the remaining spaces of the recess regions. The formation of the horizontal insulators 180 and the gate electrodes 155 may include sequentially forming a horizontal layer and a gate layer (e.g., a metal layer) to fill the recess regions and removing the horizontal layer and the gate layer from the trenches 210. Each of the horizontal insulators 180 may include a memory layer. Each of the horizontal insulators 180 may be formed to have a single- or multi-layered structure, similar to that of the vertical insulators 140. In example embodiments, the horizontal insulators 180 may include a blocking dielectric layer of a charge-trap type nonvolatile memory transistor.

As described above, in the case where, during the formation of the horizontal layer and the gate layer, the precursor materials are not effectively supplied into the recess regions, a seam or void may be formed. Since the seam or void allows extra active gas to remain therein, the presence of the seam or void may lead to the cell dissolution phenomenon.

By contrast, according to example embodiments of inventive concepts, the layered structure TS may be patterned using the second mask patterns MP described with reference to FIG. 6 to have a zigzag shape. Accordingly, it is possible to reduce a length of the recess region in the second direction D2 and consequently to fill the recess regions with the horizontal layer and gate layer without the formation of the seam or void. In other words, by changing only the shape of the mask pattern, it is possible to effectively limit (and/or prevent) the cell dissolution phenomenon from occurring, without performing an additional process.

The gate electrodes 155 and the insulating layers 110 sequentially stacked may constitute the stack SS.

Figure 5G:
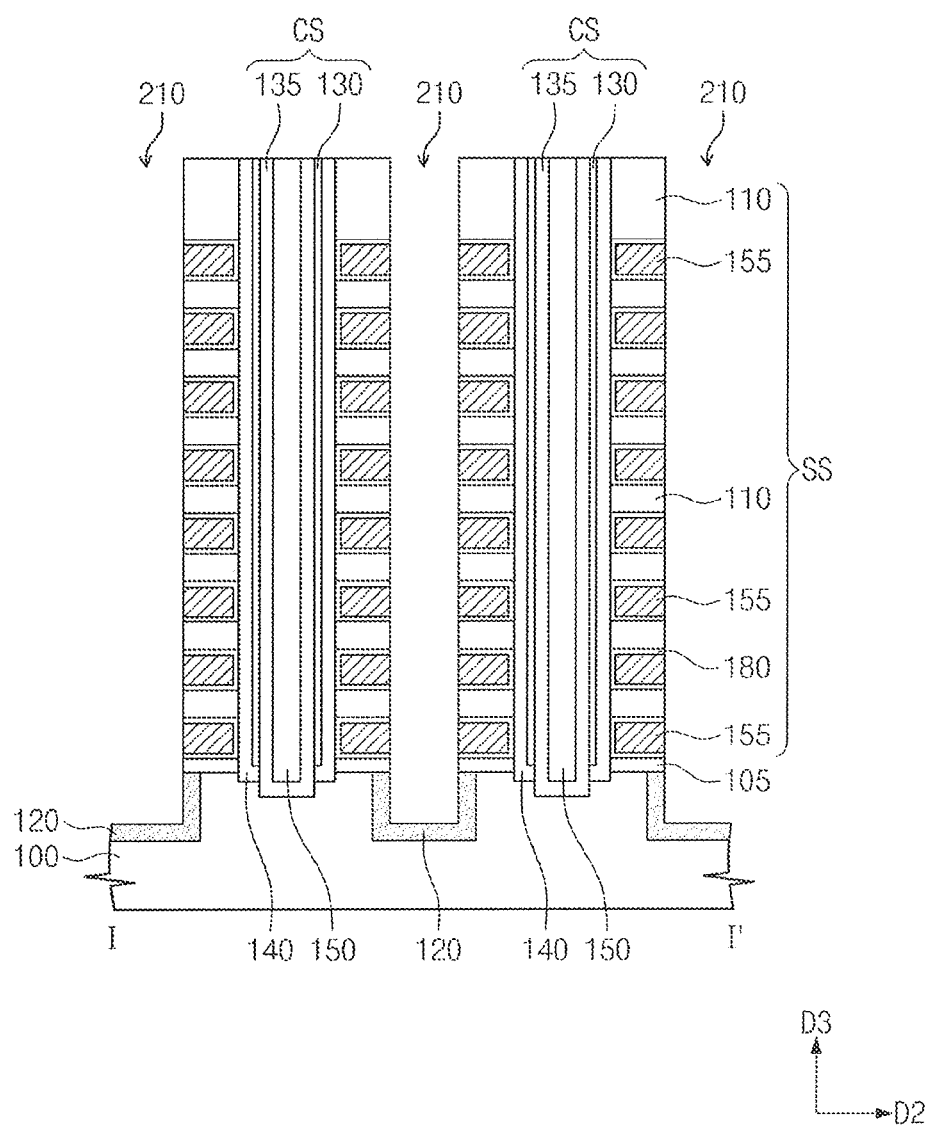

Referring to FIG. 5G, the common source regions 120 may be formed in the substrate 100, after the formation of the gate electrodes 155. The common source regions 120 may be formed by an ion implantation process and may be formed in the substrate 100 exposed by the trenches 210. Each of the common source regions 120 may also be a line shape elongated along the first direction D1 in a zigzag manner, when viewed from a plan view. In other words, the common source regions 120 may be defined by the trenches 210 between the stacks SS. The common source regions 120, in conjunction with the substrate 100, may constitute a pn junction. In a FLASH memory device according to example embodiments of inventive concepts, the common source regions 120 may be connected to each other to be in an equipotential state. However example embodiments are not limited thereto. For example, the common source regions 120 may be electrically separated from each other to be in electric potentials different from each other. Also, the common source regions 120 may constitute a plurality of source groups, which are electrically separated from each other, and each of which includes a plurality of common source regions 120.

Figure 5H:
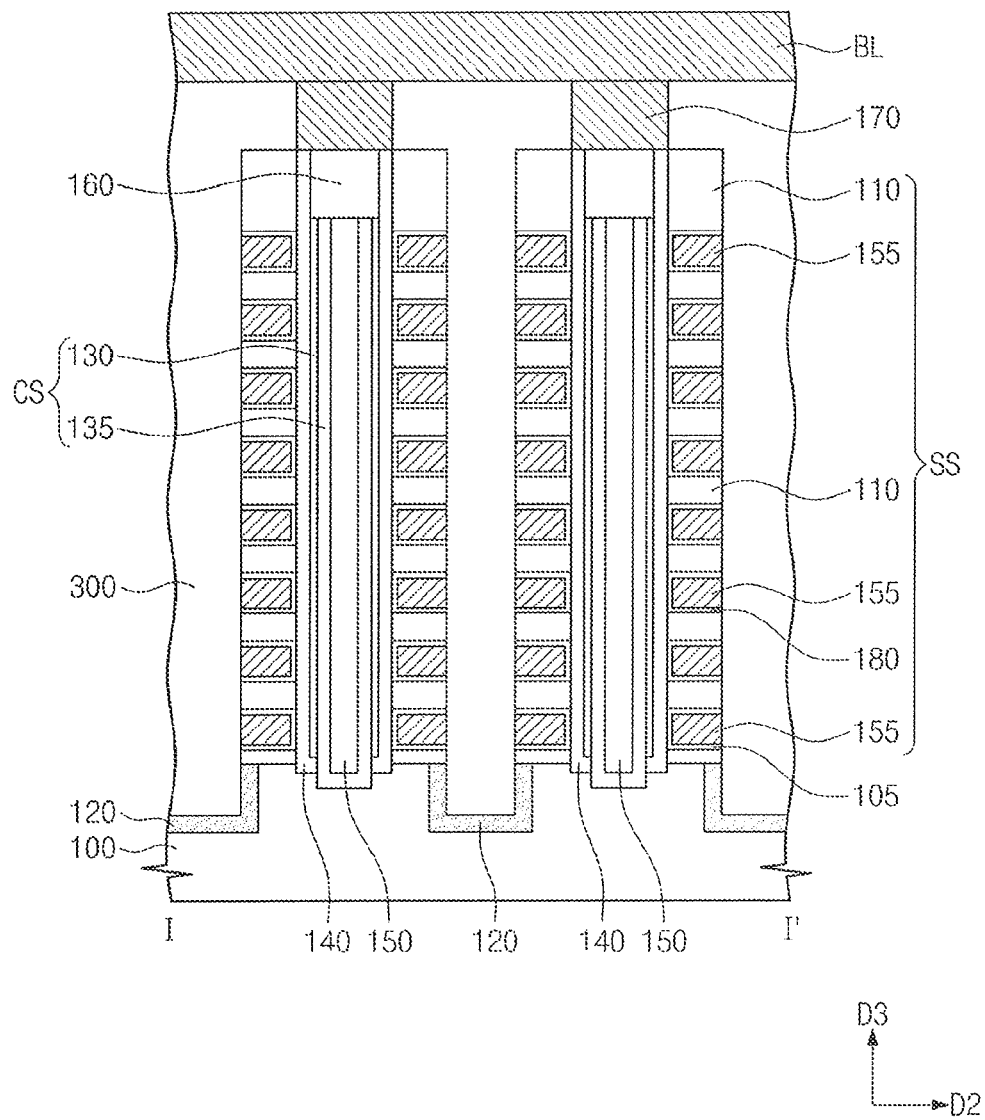

Referring to FIG. 5H, electrode separation patterns 300 may be formed on the common source regions 120 to fill the trenches 210. The electrode separation patterns 300 may be formed of at least one of a silicon oxide layer, a silicon nitride layer, or a silicon oxynitride layer.

Furthermore, the conductive pads 160 may be formed to be connected to the first and second semiconductor patterns 130 and 135. The conductive pads 160 may be formed by recessing top portions of the first and second semiconductor patterns 130 and 135 and filling the recessed portions with a conductive material. Alternatively, the conductive pads 160 may be formed by injecting impurities of a different conductivity type into the top portions of the first and second semiconductor patterns 130 and 135.

The contact plugs 170 may be formed to be connected to the conductive pads 160 and the bit line BL may be formed to be connected to the contact plugs 170. The bit line BL may be electrically connected to the first and second semiconductor patterns 130 and 135 through the contact plugs 170.

Figure 7:
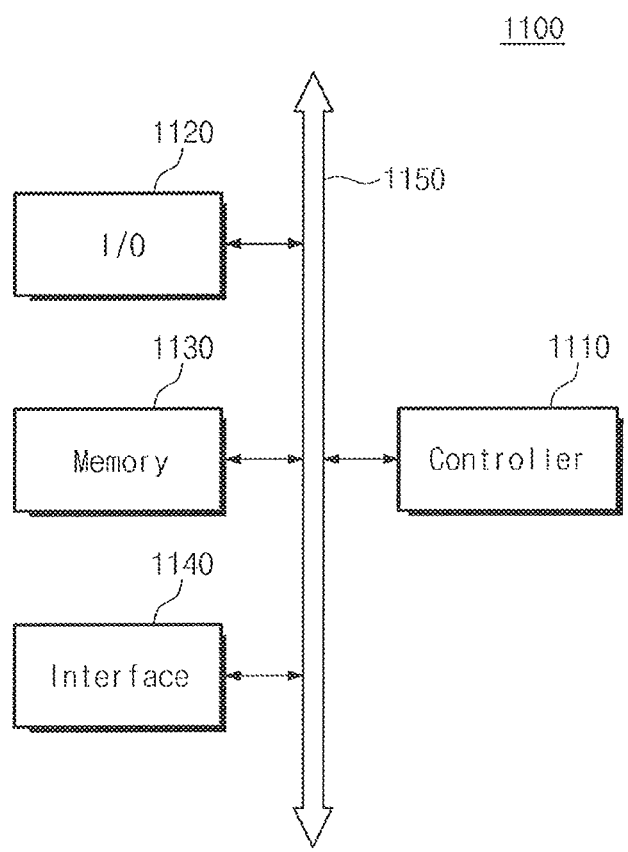
FIG. 7 is a schematic block diagram illustrating an example of a memory system including a three-dimensional semiconductor memory device according to example embodiments of inventive concepts.

FIG. 7 is a schematic block diagram illustrating an example of a memory system including a three-dimensional semiconductor memory device according to example embodiments of inventive concepts.

Referring to FIG. 7, a memory system 1100 can be applied to a personal digital assistant (PDA), a portable computer, a web tablet, a wireless phone, a mobile phone, a digital music player, a memory card and/or all the devices that can transmit and/or receive data in a wireless communication environment.

The memory system 1100 may include a controller 1110, an input-output unit 1120 (e.g., keypad, keyboard, and display), a memory 1130, an interface 1140, and a bus 1150. The memory 1130 and the interface 1140 may communicate with each other via the bus 1150.

The controller 1110 may include at least one of microprocessor, digital signal processor, a microcontroller, or other similar processing devices. The memory 1130 may be configured to store data or command processed by the controller 1110. The input-output unit 1120 may be configured to receive or output data or signals from or to the outside of the system 1100 or system 1100. For example, the input-output unit 1120 may include a keyboard, a keypad, or a display device.

The memory 1130 may include a three-dimensional semiconductor memory device according to example embodiments of inventive concepts. The memory 1130 may further include a randomly accessible volatile memory or any other type memory device.

The interface 1140 may be configured to receive or output data or signals from or to a communication network.

Further, three-dimensional semiconductor memory devices or memory systems according to example embodiments of inventive concepts can be packaged using any of various types of packages. For example, a three-dimensional semiconductor memory device or a memory system according to example embodiments of inventive concepts can be packaged with methods such as PoP (package on package), ball grid array (BGA), chip scale package (CSP), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline (SOIC), shrink small outline package (SSOP), thin small outline (TSOP), system in package (SIP), multi-chip package (MCP), wafer-level fabricated package (WFP), wafer-level processed stack package (WSP) and mounted.

Figure 8:
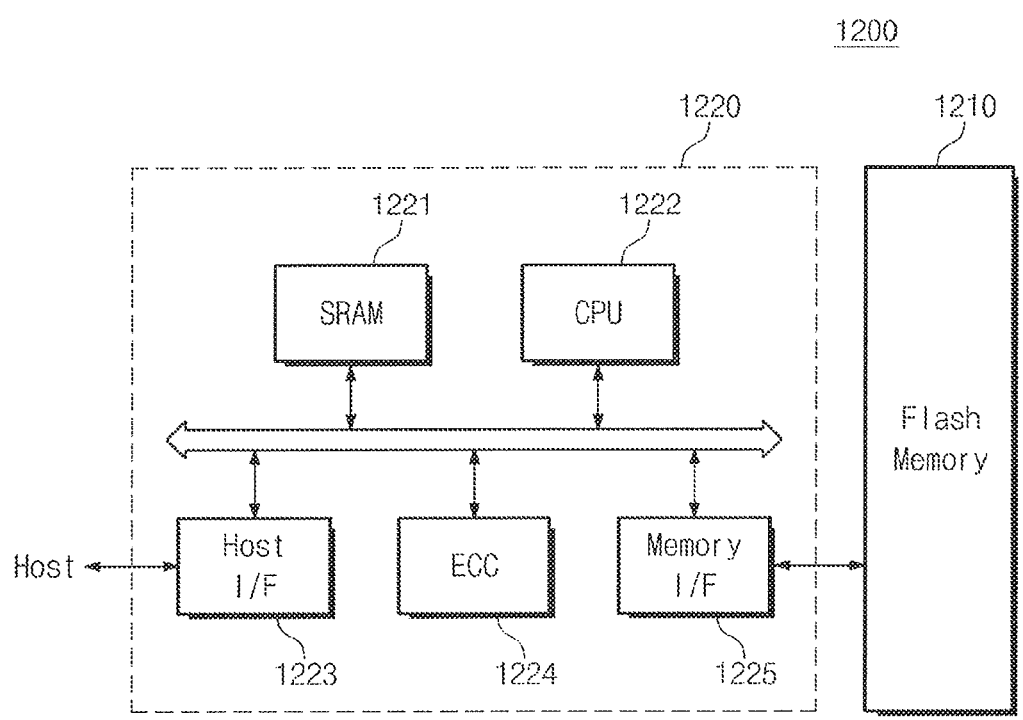
FIG. 8 is a schematic block diagram illustrating an example of a memory card including a three-dimensional semiconductor memory device according to example embodiments of inventive concepts.

FIG. 8 is a schematic block diagram illustrating an example of a memory card including a three-dimensional semiconductor memory device according to example embodiments of inventive concepts.

Referring to FIG. 8, a memory card 1200 may be configured to include a semiconductor memory device 1210, which may be one of the semiconductor devices according to example embodiments of inventive concepts. The memory card 1200 includes a memory controller 1220 configured to control a data exchange operation between a host and the semiconductor memory device 1210.

A static random access memory (SRAM) 1221 may be used as an operation memory of a processing unit 1222. A host interface 1223 includes data exchange protocols of a host to be connected to the memory card 1200. An error correction block 1224 may be configured to detect and correct errors included in data readout from the semiconductor memory device 1210 having memory cells, each of which may be configured to store multi bits. A memory interface 1225 interfaces with the semiconductor memory device 1210. The processing unit 1222 performs control operations for exchanging data of the memory controller 1220. Even though not depicted in drawings, it is apparent to one of ordinary skill in the art that the memory card 1200 according to example embodiments of inventive concepts may further include a ROM (not shown) storing code data for interfacing with the host.

Figure 9:
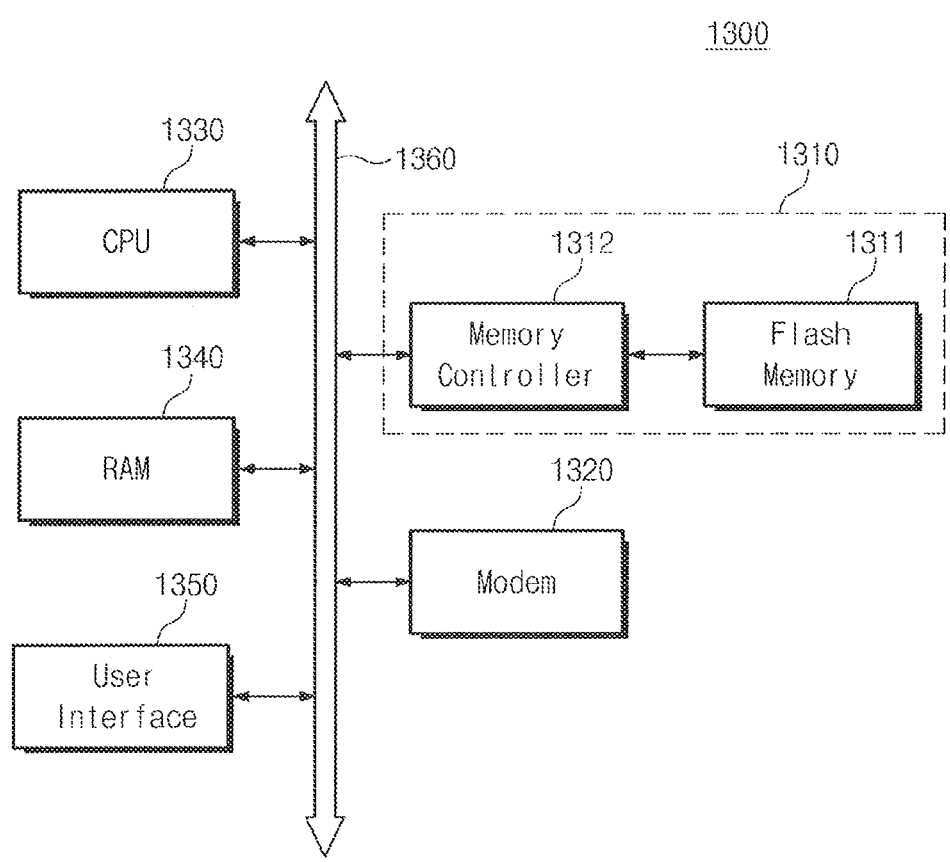
FIG. 9 is a schematic block diagram illustrating an example of an information processing system including a three-dimensional semiconductor memory device according to example embodiments of inventive concepts.

FIG. 9 is a schematic block diagram illustrating an example of an information processing system including a three-dimensional semiconductor memory device according to example embodiments of inventive concepts.

Referring to FIG. 9, an information processing system 1300 may be realized using a memory system 1310 including at least one of the three-dimensional semiconductor memory devices according to example embodiments of inventive concepts. For instance, the information processing system 1300 may be a mobile device and/or a desktop computer. In example embodiments, the information processing system 1300 may further include a modem 1320, a central processing unit (CPU) 1330, a random access memory (RAM) 1340, and a user interface 1350, which are electrically connected to a system bus 1360, in addition to the memory system 1310. The memory system 1310 may include a memory device 1311 and a memory controller 1312. In example embodiments, the memory system 1310 may be configured substantially identical to the memory system or the memory card described with reference to FIG. 7 or 8. Data processed by the CPU 1330 and/or input from the outside may be stored in the memory system 1310. In example embodiments, the memory system 1310 may be used as a portion of a solid state drive (SSD), and in this case, the information processing system 1300 may stably and reliably store a large amount of data in the memory system 1310. The increase in reliability of the memory system 1310 may allow the memory system 1310 to reduce a resource consumed for correcting errors and allow the information processing system 1300 to exchange data at a high speed. Although not illustrated, it is apparent to those skilled in the art that, for example, an application chipset, a camera image sensor, a camera image signal processor (ISP), an input/output device, or the like may further be included in the information processing system 1300 according to example embodiments of inventive concepts.

According to example embodiments of inventive concepts, by changing a shape of a stack, it is possible to limit (and/or prevent) a cell dissolution phenomenon from occurring in a semiconductor device. Furthermore, it is possible to improve structural stability of the stack and to reduce an occupying area of the stacks and thereby increase an integration density of the semiconductor device.

While some example embodiments of inventive concepts have been particularly shown and described, it will be understood by one of ordinary skill in the art that variations in form and detail may be made therein without departing from the spirit and scope of the attached claims.

What is claimed is:

1. A semiconductor device comprising:
a substrate;
a first insulating layer disposed on the substrate;
a first gate electrode disposed on the first insulating layer;
a second insulating layer disposed on the first gate electrode;
a second gate electrode disposed on the second insulating layer;
a third insulating layer disposed on the second gate electrode;
a third gate electrode disposed on the third insulating layer, and including a first portion and a second portion; and
a plurality of channels penetrating the first insulating layer, the first gate electrode, the second insulating layer, the second gate electrode, the third insulating layer and the third gate electrode, and electrically connected to the substrate,
wherein a cutting region is disposed between the first portion of the third gate electrode and the second portion of the third gate electrode, the plurality of channels include a first channel, a second channel, a third channel and a fourth channel, the first portion of the third gate electrode includes a first sidewall at the cutting region and a second sidewall opposite to the first sidewall, the second portion of the third gate electrode includes a third sidewall at the cutting region and a fourth sidewall opposite to the third sidewall, the first sidewall has a first recess, a second recess and a first protrusion between the first recess and the second recess, the second sidewall has a third recess, a fourth recess and a second protrusion between the third recess and the fourth recess, the third sidewall has a fifth recess, a sixth recess and a third protrusion between the fifth recess and the sixth recess, the fourth sidewall has a seventh recess, an eighth recess and a fourth protrusion between the seventh recess and the eighth recess, the first channel and the second channel penetrate the first portion of the third insulating layer, the third channel and the fourth channel penetrate the second portion of the third insulating layer, the first channel is closer to the first sidewall than to the second sidewall, the second channel is closer to the second sidewall than to the first sidewall, the third channel is closer to the third sidewall than to the fourth sidewall, the fourth channel is closer to the fourth sidewall than to the third sidewall, a first imaginary straight line connecting the first recess and the second recess crosses the first channel, a second imaginary straight line connecting the third recess and the fourth recess crosses the second channel, a third imaginary straight line connecting the fifth recess and the sixth recess crosses the third channel, and a fourth imaginary straight line connecting the seventh recess and the eighth recess crosses the fourth channel.

2. The semiconductor device of claim 1, wherein the substrate includes a common source region on which the first insulating layer is disposed.

3. The semiconductor device of claim 1, wherein the first insulating layer is thinner than the second insulating layer, and thinner than the third insulating layer.

4. The semiconductor device of claim 1, wherein each of the plurality of channels includes a semiconductor pattern which penetrates the first insulating layer, the first gate electrode, the second insulating layer, the second gate electrode, the third insulating layer and the third gate electrode, and which is electrically connected to the substrate.

5. The semiconductor device of claim 1, wherein the first gate electrode serves for a ground selection transistor, and the third gate electrode serves for a string selection transistor.

6. The semiconductor device of claim 1, further comprising a plurality of conductive pads disposed on the plurality of channels.

7. The semiconductor device of claim 1, further comprising an electrode separation pattern filling the cutting region.

8. The semiconductor device of claim 1, wherein the first channel is disposed between the first protrusion and the third recess, the second channel is disposed between the second protrusion and the first recess, the third channel is disposed between the third protrusion and the seventh recess, and the fourth channel is disposed between the fourth protrusion and the fifth recess.

9. The semiconductor device of claim 1, wherein each of the first recess, the second recess, the third recess, the fourth recess, the fifth recess, the sixth recess, the seventh recess and the eighth recess is rounded, and each of the first protrusion, the second protrusion, the third protrusion and the fourth protrusion is rounded.

10. The semiconductor device of claim 1, wherein the plurality of channels include a fifth channel penetrating the first portion of the stack and disposed closer to the first sidewall than to the second sidewall, the first recess is disposed between the first channel and the fifth channel, and a fifth imaginary straight line connecting the first channel and the fifth channel crosses the first recess.

11. A semiconductor device comprising:

a substrate:

a stack disposed on the substrate, and including a first portion and a second portion, the stack including a first insulating layer disposed on the substrate, a first gate electrode disposed on the first insulating layer, a second insulating layer disposed on the first gate electrode, a second gate electrode disposed on the second insulating layer, a third insulating layer disposed on the second gate electrode, a third gate electrode disposed on the third insulating layer; and a plurality of channels penetrating the stack, and electrically connected to the substrate, wherein a cutting region is disposed between the first portion of the stack and the second portion of the stack, each of the first insulating layer, the first gate electrode, the second insulating layer, the second gate electrode, the third insulating layer and the third gate electrode is at least partially divided into two portions by the cutting region, the plurality of channels include a first channel, a second channel, a third channel and a fourth channel, the first portion of the stack includes a first sidewall at the cutting region and a second sidewall opposite to the first sidewall, the second portion of the stack includes a third sidewall at the cutting region and a fourth sidewall opposite to the third sidewall, the first sidewall has a first recess, a second recess and a first protrusion between the first recess and the second recess, the second sidewall has a third recess, a fourth recess and a second protrusion between the third recess and the fourth recess, the third sidewall has a fifth recess, a sixth recess and a third protrusion between the fifth recess and the sixth recess, the fourth sidewall has a seventh recess, an eighth recess and a fourth protrusion between the seventh recess and the eighth recess, the first channel and the second channel penetrate the first portion of the stack, the third channel and the fourth channel penetrate the second portion of the stack, the first channel is closer to the first sidewall than to the second sidewall, the second channel is closer to the second sidewall than to the first sidewall, the third channel is closer to the third sidewall than to the fourth sidewall, the fourth channel is closer to the fourth sidewall than to the third sidewall, a first imaginary straight line connecting the first recess and the second recess crosses the first channel, a second imaginary straight line connecting the third recess and the fourth recess crosses the second channel, a third imaginary straight line connecting the fifth recess and the sixth recess crosses the third channel, a fourth imaginary straight line connecting the seventh recess and the eighth recess crosses the fourth channel, the first channel is disposed between the first protrusion and the third recess, the second channel is disposed between the second protrusion and the first recess, the third channel is disposed between the third protrusion and the seventh recess, and the fourth channel is disposed between the fourth protrusion and the fifth recess.

12. The semiconductor device of claim 11, wherein each of the first recess, the second recess, the third recess, the fourth recess, the fifth recess, the sixth recess, the seventh recess and the eighth recess is rounded, and each of the first protrusion, the second protrusion, the third protrusion and the fourth protrusion is rounded.

13. The semiconductor device of claim 11, wherein the first protrusion faces the fifth recess, and the third protrusion faces the first recess.

14. The semiconductor device of claim 11, wherein the first insulating layer is thinner than the second insulating layer, and thinner than the third insulating layer.

15. The semiconductor device of claim 11, wherein the plurality of channels include a fifth channel penetrating the first portion of the stack and disposed closer to the first sidewall than to the second sidewall, the first recess is disposed between the first channel and the fifth channel, and a fifth imaginary straight line connecting the first channel and the fifth channel crosses the first recess.

16. A semiconductor device comprising:

a substrate;

a stack disposed on the substrate, and including a first portion and a second portion, the stack including a first insulating layer disposed on the substrate, a first gate electrode disposed on the first insulating layer, a second insulating layer disposed on the first gate electrode, a second gate electrode disposed on the second insulating layer, a third insulating layer disposed on the second gate electrode, a third gate electrode disposed on the third insulating layer; and a plurality of channels penetrating the stack, and electrically connected to the substrate, wherein a cutting region is disposed between the first portion of the stack and the second portion of the stack, each of the first insulating layer, the first gate electrode, the second insulating layer, the second gate electrode, the third insulating layer and the third gate electrode is at least partially divided into two portions by the cutting region, the plurality of channels include a first channel, a second channel, a third channel and a fourth channel, the first portion of the stack includes a first sidewall at the cutting region and a second sidewall opposite to the first sidewall, the second portion of the stack includes a third sidewall at the cutting region and a fourth sidewall opposite to the third sidewall, the first sidewall has a first recess, a second recess and a first protrusion between the first recess and the second recess, the second sidewall has a third recess, a fourth recess and a second protrusion between the third recess and the fourth recess, the third sidewall has a fifth recess, a sixth recess and a third protrusion between the fifth recess and the sixth recess, the fourth sidewall has a seventh recess, an eighth recess and a fourth protrusion between the seventh recess and the eighth recess, the first channel and the second channel penetrate the first portion of the stack, the third channel and the fourth channel penetrate the second portion of the stack, the first channel is closer to the first sidewall than to the second sidewall, the second channel is closer to the second sidewall than to the first sidewall, the third channel is closer to the third sidewall than to the fourth sidewall, the fourth channel is closer to the fourth sidewall than to the third sidewall, a first imaginary straight line connecting the first recess and the second recess crosses the first channel, a second imaginary straight line connecting the third recess and the fourth recess crosses the second channel, a third imaginary straight line connecting the fifth recess and the sixth recess crosses the third channel, a fourth imaginary straight line connecting the seventh recess and the eighth recess crosses the fourth channel, each of the first recess, the second recess, the third recess, the fourth recess, the fifth recess, the sixth recess, the seventh recess and the eighth recess is rounded, and each of the first protrusion, the second protrusion, the third protrusion and the fourth protrusion is rounded.

17. The semiconductor device of claim 16, wherein the first channel is disposed between the first protrusion and the third recess, the second channel is disposed between the second protrusion and the first recess, the third channel is disposed between the third protrusion and the seventh recess, and the fourth channel is disposed between the fourth protrusion and the fifth recess.

18. The semiconductor device of claim 16, wherein the first protrusion faces the fifth recess, and the third protrusion faces the first recess.

19. The semiconductor device of claim 16, wherein the plurality of channels include a fifth channel penetrating the first portion of the stack and disposed closer to the first sidewall than to the second sidewall, the first recess is disposed between the first channel and the fifth channel, and a fifth imaginary straight line connecting the first channel and the fifth channel crosses the first recess.

20. The semiconductor device of claim 16, wherein the first insulating layer is thinner than the second insulating layer, and thinner than the third insulating layer.

* * * * *